United States Patent [19]

Uchida

[11] Patent Number: 5,926,046

[45] Date of Patent: Jul. 20, 1999

[54] SEMICONDUCTOR INTEGRATED CIRCUIT EMPLOYING SMALLER NUMBER OF ELEMENTS TO PROVIDE PHASE-LOCKED CLOCK SIGNAL

[75] Inventor: Toshiya Uchida, Kawasaki, Japan

[73] Assignee: Fujitsu Limited, Kanagawa, Japan

[21] Appl. No.: 08/794,499

[22] Filed: Feb. 4, 1997

[30] Foreign Application Priority Data

Aug. 30, 1996 [JP] Japan .................................. 8-230672

[51] Int. Cl.$^6$ .............................. H03K 5/04; H03L 7/00
[52] U.S. Cl. .................... 327/158; 327/149; 327/276; 327/156; 331/57
[58] Field of Search .................................. 327/147–150, 327/152, 153, 156–159, 161, 276–278, 281; 331/17, 57

[56] References Cited

U.S. PATENT DOCUMENTS 5,619,170  4/1997  Nakamura ................................ 327/158
5,642,082  6/1997  Jefferson ................................. 327/157
5,734,301  3/1998  Lee et al. ................................. 327/148

*Primary Examiner*—Timothy P. Callahan
*Assistant Examiner*—Eunja Shin
*Attorney, Agent, or Firm*—Nikaido Marmelstein Murray & Oram, LLP

[57] ABSTRACT

A semiconductor integrated circuit has a voltage generator, a delay gate array, and a current controller. The voltage generator generates an output voltage in response to voltage control signals. The delay gate array has cascaded delay gates for producing a delay. The current controller controls a current flowing to the delay gate array in response to the output voltage of the voltage generator. Consequently, the voltage control signals control the delay produced by the delay gate array. This circuit is capable of precisely controlling the delay with a small number of elements and a small circuit scale.

14 Claims, 34 Drawing Sheets

DECREMENT

SUSTAIN

INCREMENT

SEMICONDUCTOR INTEGRATED CIRCUIT EMPLOYING SMALLER NUMBER OF ELEMENTS TO PROVIDE PHASE-LOCKED CLOCK SIGNAL

BACKGROUND OF THE INVENTION

1. Field of the Invention

The present invention relates to a semiconductor integrated circuit employing a smaller number of elements to provide a phase-locked clock signal.

2. Description of the Related Art

Recent memory devices operate at a high speed of, for example, over 100 MHz, and therefore, employ a DLL (delay locked line) circuit to lock the phase of an internal clock signal with respect to the phase of an external clock signal, thereby suppressing an access delay or an access fluctuation in a real internal clock signal line.

The DLL circuit employs a dummy line for transmitting a dummy internal clock signal and estimates a propagation delay due to load on the real internal clock signal line.

Namely, a high-speed, highly-integrated semiconductor circuit needs a phase-locked clock signal. For example, a synchronized DRAM (SDRAM) must provide a phase-locked clock signal to output buffers. The phase-locked clock signal is generated by a delay-locked line (DLL) circuit having delay gates and control circuits that occupy a large area.

The prior arts and their associated problems will be described in detail later with reference to the accompanying drawings.

SUMMARY OF THE INVENTION

An object of the present invention is to provide a semiconductor integrated circuit employing a small number of elements to precisely control a delay in a clock signal.

According to the present invention, there is provided a semiconductor integrated circuit comprising a voltage generator for receiving voltage control signals and for generating an output voltage in response to the voltage control signals; a delay gate array having delay gates for producing a delay; and a current control circuit for controlling a current flowing to the delay gate array in response to the output voltage of the voltage generator, thereby controlling the delay produced by the delay gate array.

Further, according to the present invention, there is also provided a semiconductor integrated circuit having first and second delay controllers for receiving an input signal; a plurality of object circuits for receiving an internal signal output from the first delay circuit through a real line; a dummy line for providing a dummy delay corresponding to a delay in the real line; and a phase comparator for receiving the input signal and a dummy internal signal output from the second delay controller through the dummy line, for comparing phases of the received input and dummy internal signals with each other, and for controlling delays in the first and second delay controllers in accordance with the comparison result, each of the first and second delay controllers comprising a voltage generator for receiving voltage control signals output from the phase comparator and for generating an output voltage in response to the voltage control signals; a delay gate array having delay gates for producing a delay; and a current control circuit for controlling a current flowing to the delay gate array in response to the output voltage of the voltage generator, thereby controlling the delay produced by the delay gate array.

The voltage generator may comprise a resistor and a plurality of transistors having different sizes and turned ON and OFF in response to the voltage control signals, so that the resistor and turned-ON ones of the transistors divide a source voltage and provide the output voltage of the voltage generator. The transistors may have different ON resistance values that increase in geometric progression, and any one of the transistors may be turned ON in response to the voltage control signals. The transistors may have different gate widths that increase in geometric progression.

The transistors may have different ON resistance values that increase in powers of 2, and the voltage control signals may serve as binary counter outputs. The transistors may have different gate widths that increase in powers of 2.

The current control circuit may be a p-channel type MOS transistor, and the transistors of the voltage generator may be n-channel type MOS transistors. The semiconductor integrated circuit may be a synchronous DRAM, and the object circuits may be data output buffer circuits of the synchronous DRAM. The input signal may serve as an enable signal for the data output buffer circuits.

BRIEF DESCRIPTION OF THE DRAWINGS

The present invention will be more clearly understood from the description of preferred embodiments as set forth below with reference to the accompanying drawings, wherein.

DESCRIPTION OF THE PREFERRED EMBODIMENTS

For a better understanding of the preferred embodiments of the present invention, a related art and the problem thereof will be explained.

Recent memory devices operate at a high speed of, for example, over 100 MHz, and therefore, employ a DLL (delay locked line) circuit to lock the phase of an internal clock signal with respect to the phase of an external clock signal, thereby suppressing an access delay or an access fluctuation in a real internal clock signal line. The DLL circuit employs a dummy line for transmitting a dummy internal clock signal and estimates a propagation delay due to load on the real internal clock signal line.

Figure 1:
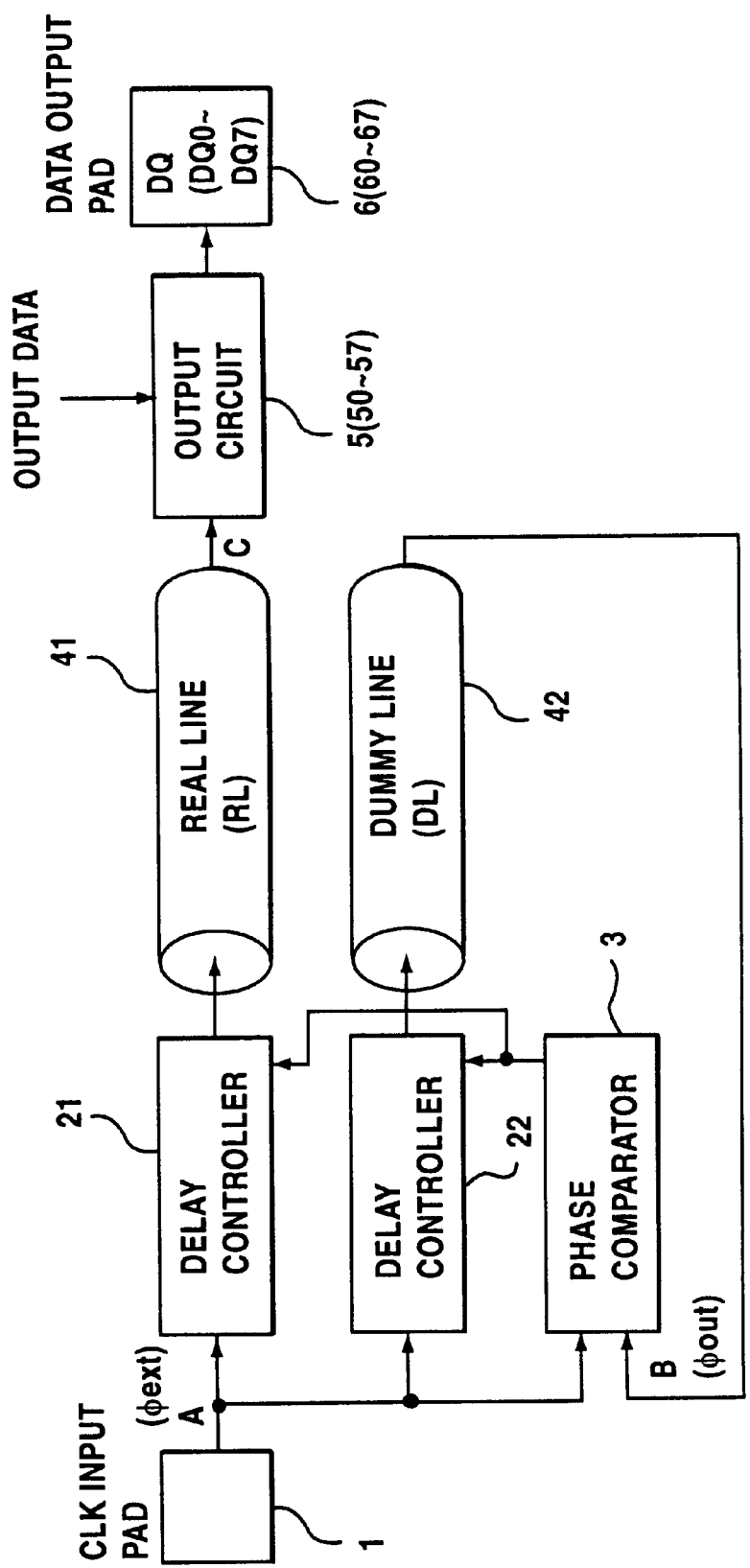
FIG. 1 is a block diagram showing a semiconductor integrated circuit according to a related art.

FIG. 1 is a block diagram showing an example of the DLL circuit according to the related art. The circuit has a clock signal input pad 1, an output circuit 5, a data output pad (DQ) 6, a phase comparator 3, delay controllers 21 and 22 that control delays according to (in response to) the output of the phase comparator 3, a real line 41 for transmitting an internal clock signal from the delay controller 21 to the output circuit 5, and a dummy line 42 having the same load as the real line 41, for transmitting a dummy internal clock signal. When the DLL circuit is applied to an SDRAM, the output circuit 5 and pad 6 may consist of output circuits 50 to 57 and pads 60 to 67 (DQ0 to DQ7).

The phase comparator 3 compares the phase of an input signal A, which is a reference signal φext and is also supplied to the delay controllers 21 and 22, with the phase of an input signal B, which is a comparison object signal φout, i.e., the dummy signal. According to the comparison result, the delay controllers 21 and 22 control delays therein so that the signal B is behind the signal A by one clock period. As a result, the internal clock signal supplied to the output circuit 5 is behind the input signal A by one clock period, to apparently suppress a propagation delay in the real line 41. Using the dummy line 42 for controlling a delay in the real line 41 is advantageous because the dummy and real lines 42 and 41 do not restrict each other's location on a chip. This expands the freedom of designing and wiring the circuit.

Figure 2A:
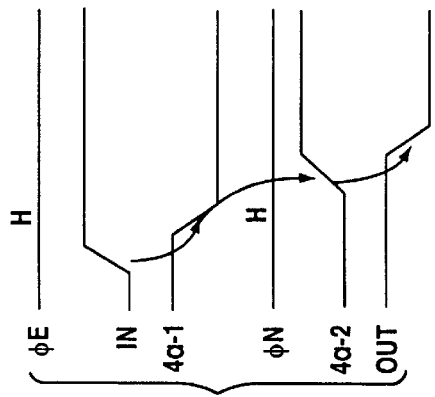
FIGS. 2A to 2C show a delay section of a delay controller of the circuit of FIG. 1.
Figure 2B:
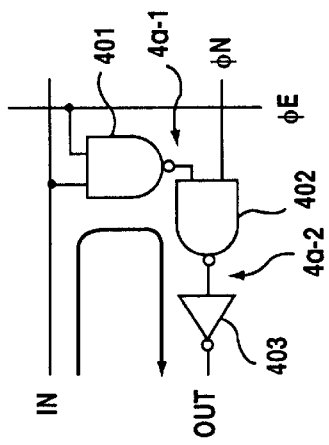
Figure 2C:
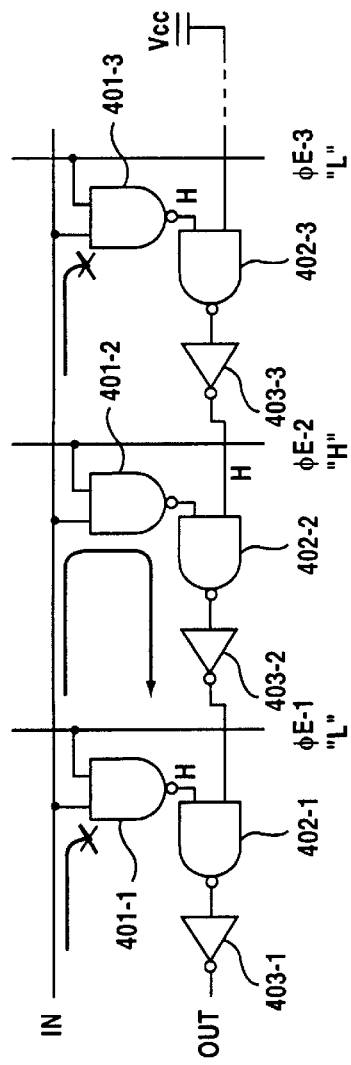

FIGS. 2A to 2C show a delay section of any one of the delay controllers 21 and 22 of FIG. 1, in which FIG. 2A shows a 1-bit delay element, FIG. 2B is a time chart showing the operation of the 1-bit delay element, and FIG. 2C shows cascaded 1-bit delay elements.

The 1-bit delay element has two NAND gates 401 and 402 and an inverter 403. An enable signal φE is high in FIG. 2B to activate the 1-bit delay element. The 1-bit delay element receives an input signal IN and a signal φN, which is an output signal of another 1-bit delay element on the right side, and provides an output signal OUT. Nodes 4a-1 and 4a-2 provide waveforms shown in FIG. 2B. The output signal OUT is a signal φN to another 1-bit delay element on the left side.

When the signal φN is low, the output signal OUT is always low. If the signal φN is high and the signal φE is low, the output signal OUT is high. If the signal φN is high with the signal φE being high and the input signal IN being low, the output signal OUT is high, and with the input signal IN being high, the output signal OUT is low.

If the input signal IN rises with the enable signal φE being high, the input signal IN is transmitted through a path indicated with an arrow mark. If the enable signal φE is low, the input signal IN is blocked from the path.

In FIG. 2C, the 1-bit delay elements are cascaded to form the delay section of the delay controller 21 (22). Although FIG. 2C shows only three 1-bit delay elements, many elements are cascaded in reality (for example, 150 elements or more as will be explained later), and each element is provided with a signal line such as φE-1, φE-2, or φE-3 each for transmitting an enable signal φE. These enable signals are controlled by a control section of the delay controller 21 (22).

In FIG. 2C, the enable signal φE-2 is high to activate the center 1-bit delay element. If the input signal IN changes from low to high, the NAND gates 401-1 and 401-3 of the left and right 1-bit delay elements block the input signal IN as indicated with thick lines because their enable signals φE-1 and φE-3 are each low.

On the other hand, the NAND gate 401-2 of the center 1-bit delay element passes the input signal IN because its enable signal φE-2 is high. The NAND gate 402-2 thereof also passes the input signal IN because the output signal OUT (φN) of the right 1-bit delay element is high. Then, the center 1-bit delay element provides the output signal OUT of low. If the output signal OUT (φN) of the right 1-bit delay element is low, the output signal OUT of the 1-bit delay element that receives the output signal is always low. Accordingly, the output signal OUT of the center 1-bit delay element is transmitted through the NAND gate and inverter of the left 1-bit delay element and is provided as a final output signal.

In this way, the input signal IN is transmitted through an activated 1-bit delay element, to form a final output signal.

Namely, controlling the enable signal φE of a required 1-bit delay element to high will control a delay in the delay controller 21 (22). The delay of a 1-bit delay element is determined by the total signal propagation time of the NAND gates and inverter of the element and forms a unit delay time. A total delay time is calculated by multiplying the number of 1-bit delay elements the input signal IN passes through by the unit delay time.

Figure 3:
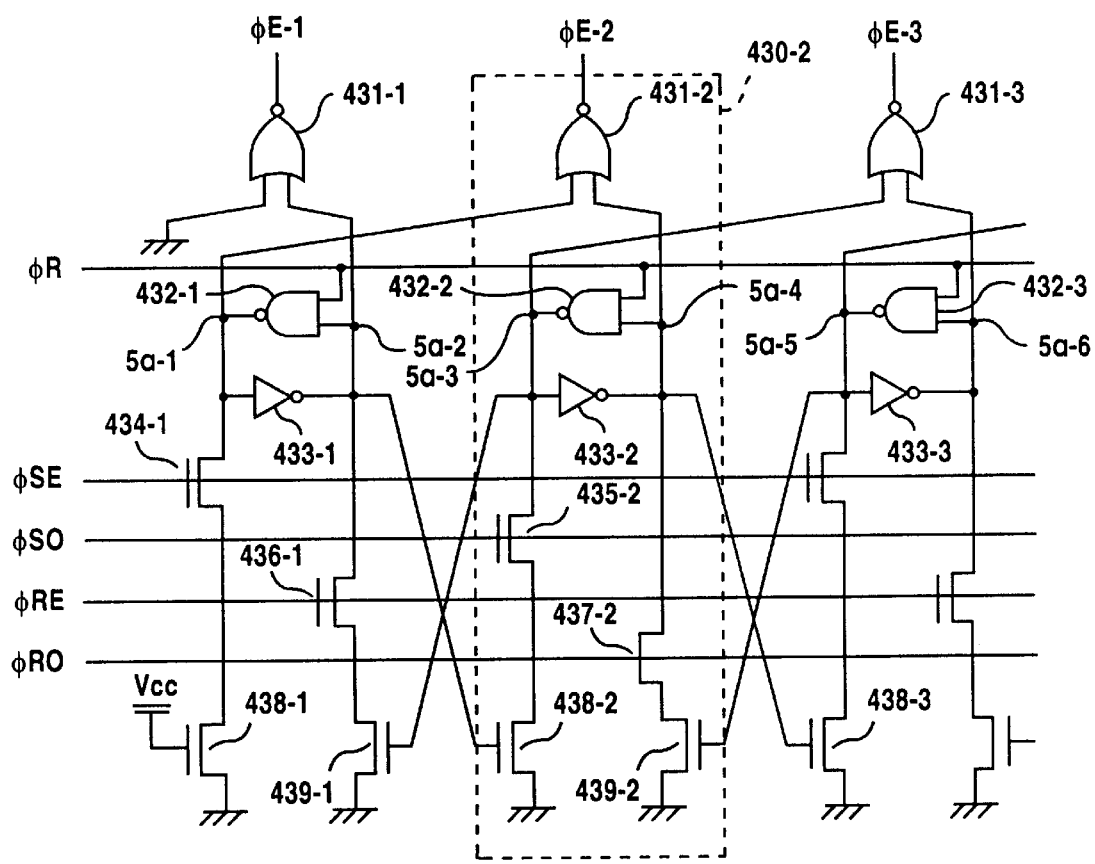
FIG. 3 is a circuit diagram showing a control section of the delay controller of the circuit of FIG. 1.

FIG. 3 is a circuit diagram showing a control section of the delay controller 21 (22) of FIG. 1.

The control section consists of 1-bit control elements among which one surrounded with a dotted line in FIG. 3 is a 1-bit control element 430-2. Each element provides an enable signal φE to a corresponding one of the 1-bit delay elements (FIG. 2).

The 1-bit control element 430-2 consists of a flip-flop having a NAND gate 432-2 and an inverter 433-2, transistors 435-2, 438-2, 437-2, and 439-2, and a NOR gate 431-2. The gate of the transistor 438-2 is connected to a node 5a-2 of a front 1-bit control element. The gate of the transistor 439-2 is connected to a node 5a-5 of a rear 1-bit control element. Incremental signals, i.e., set signals φSE and φSO and decremental signals, i.e., reset signals φRE and φRO are connected alternately to the 1-bit control elements.

In the center 1-bit control element 430-2, the gate of the transistor 435-2 receives the set signal φSO, and the gate of the transistor 437-2 receives the reset signal φRO. The gates of other transistors of the front and rear 1-bit control elements receive the set signal φSE and reset signal φRE. The NOR gate 431-2 receives a signal from a node 5a-1 of the front element and a signal from a node 5a-4 of its own. A signal φR resets the delay controller 21 (22). The signal φR is once set to low when a power source is turned on and is fixed to high thereafter.

Figure 4:
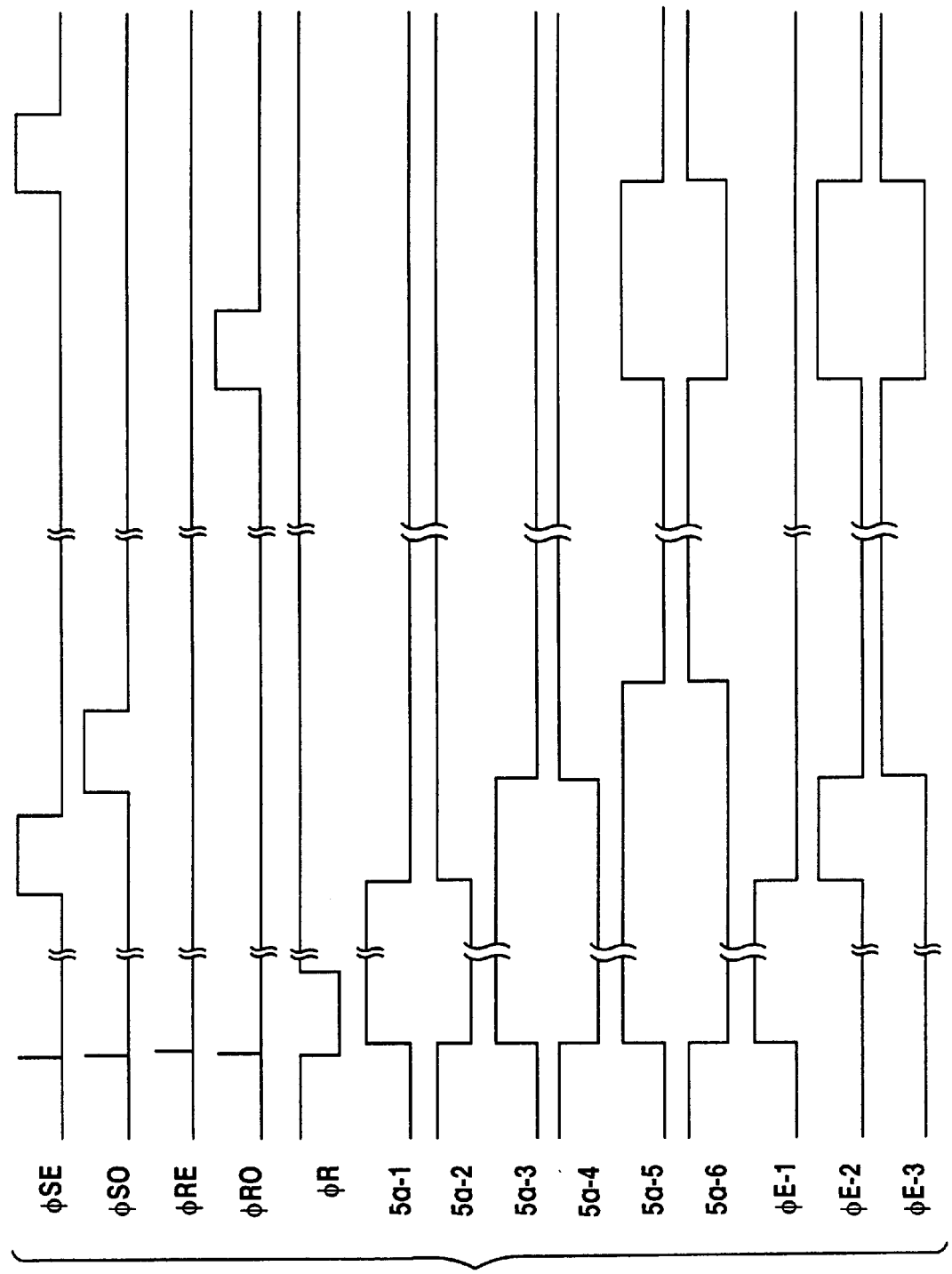
FIG. 4 is a timing chart showing the operation of the control section of FIG. 3.

FIG. 4 is a timing chart showing the operation of the circuit of FIG. 3.

The reset signal φR is once set to low so that the nodes 5a-1, 5a-3, and 5a-5 are set to high and the nodes 5a-2, 5a-4, and 5a-6 to low. To carry out an incremental operation, the incremental signals, i.e., the set signals φSE and φSO are set to high and low alternately.

When the set signal φSE is changed from low to high, the node 5a-1 is grounded to low, and the node 5a-2 is changed to high. Accordingly, the enable signal φE-1 changes from high to low. This state is latched by the flip-flop, and therefore, the enable signal φE-1 keeps the low level even if the set signal φSE returns to low. When the node 5a-1 changes to low, the enable signal φE-2 changes from low to high. When the node 5a-2 changes to high, the transistor 438-2 is turned on. When the set signal φSO changes from low to high, the node 5a-3 is grounded to low, and the node 5a-4 changes to high. As a result, the enable signal φE-2 changes from high to low. This state is latched by the flip-flop, and therefore, the enable signal φE-2 keeps the low level even if the set signal φSO returns to low.

When the node 5a-3 changes to low, the enable signal φE-3 changes from low to high. Although FIG. 4 shows each one pulse of the set signals φSE and φSO, many 1-bit control elements are connected to one another in reality. Accordingly, when the set signals φSE and φSO are alternately set to high and low, the 1-bit control element that provides the enable signal φE of high level will shift to the right sequentially. If the comparison result from the phase comparator 3 indicates that a delay must be increased, the set signals φSE and φSO will alternately be set to high and low.

When the incremental (set) signals φSE and φSO and decremental (reset) signals φRE and φRO are kept low, the 1-bit control element that provides an enable signal φE of high level is fixed. Accordingly, if the comparison result from the phase comparator 3 indicates to keep a delay, the signals φSE, φSO, φRE, and φRO are held low.

When carrying out a decremental operation, the reset signals φRE and φRO are alternately provided so that the 1-bit control element that provides an enable signal φE of high level may shift to the left sequentially.

In this way, the control section of FIG. 3 of the delay controller 21 (22) shifts the 1-bit control element that provides an enable signal φE of high level element by element, to control the 1-bit delay elements of FIG. 2C element by element.

Figure 5:
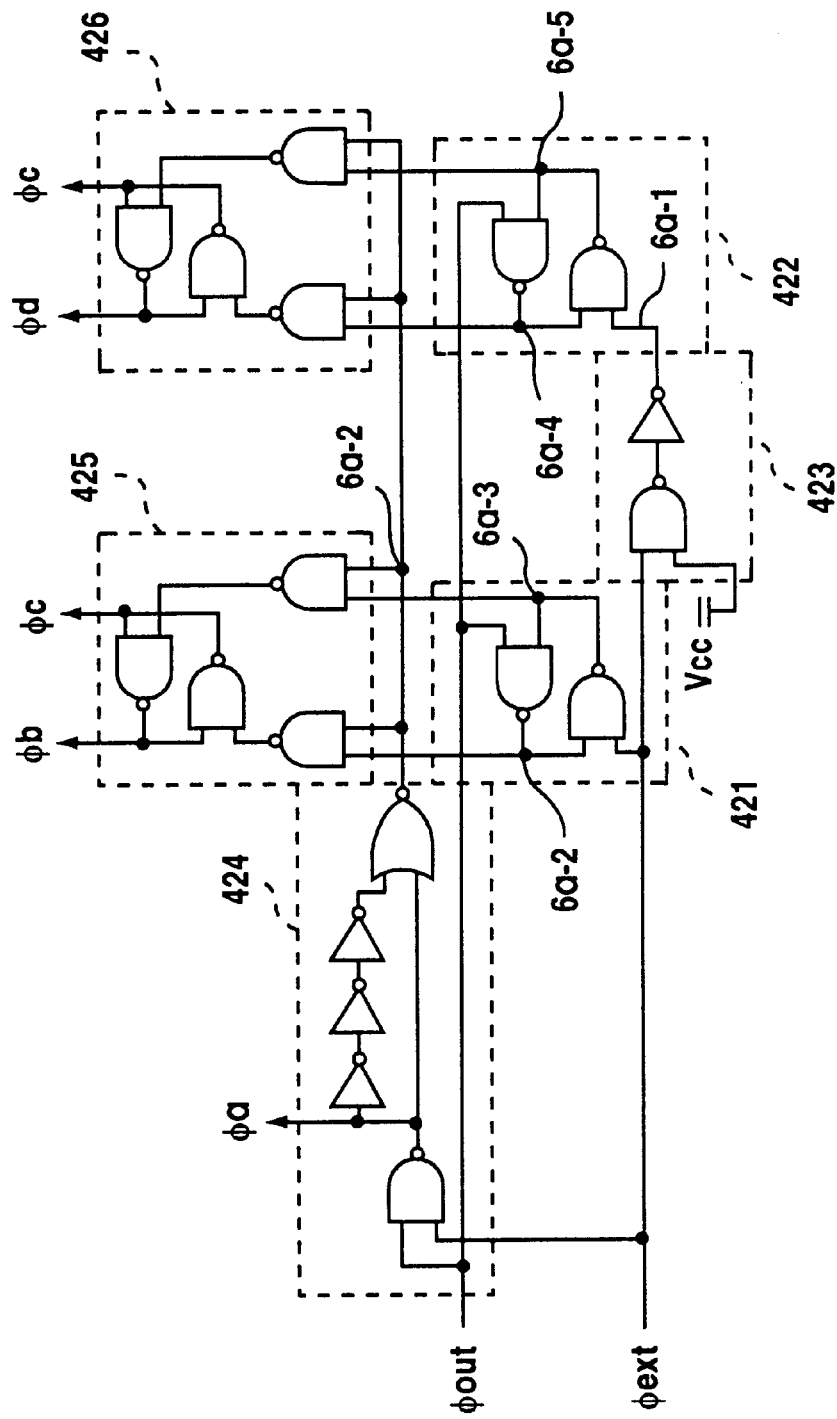
FIG. 5 is a circuit diagram showing a phase comparing section of a phase comparator of the circuit of FIG. 1.

FIG. 5 shows a phase comparing section of the phase comparator 3 of FIG. 1, and FIGS. 6A to 6C are timing charts showing the operation of the phase comparing section.

Figure 7:
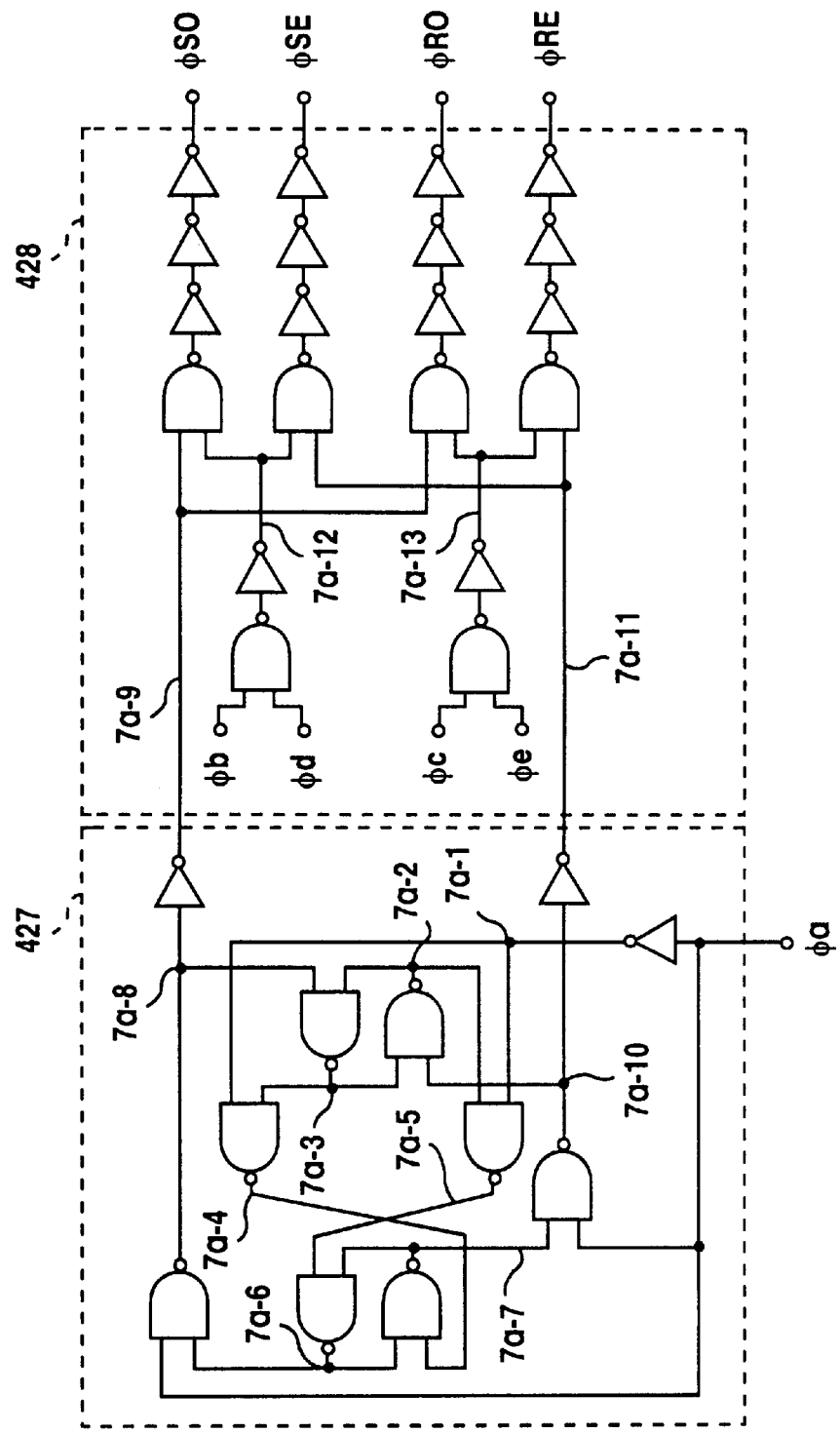
FIG. 7 is a circuit diagram showing an amplifying section of the phase comparator of the circuit of FIG. 1.

The phase comparator 3 consists of the phase comparing section of FIG. 5 and an amplifying section of FIG. 7.

In FIG. 5, the phase comparing section compares the dummy internal clock signal φout with the external clock signal φext serving as a reference signal. Output signals φa to φe are transferred to the amplifying section.

The phase comparing section is composed of flip-flops 421 and 422 each having two NAND gates, latches 425 and 426 for latching the states of the flip-flops 421 and 422, respectively, a generator 424 for generating an activation signal for the latches 425 and 426, and a 1-delay circuit 423 for obtaining a phase allowance for the external clock signal φext.

Figure 6C:
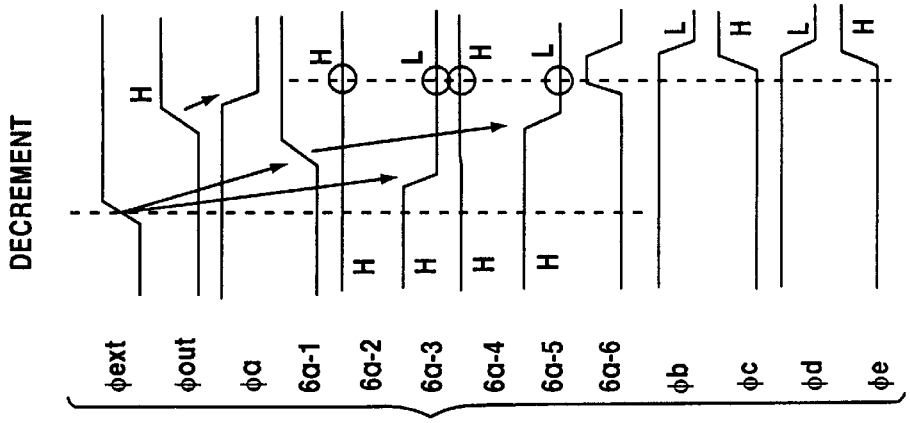
FIGS. 6A to 6C are timing charts showing the operation of the phase comparing section of FIG. 5.
Figure 6B:
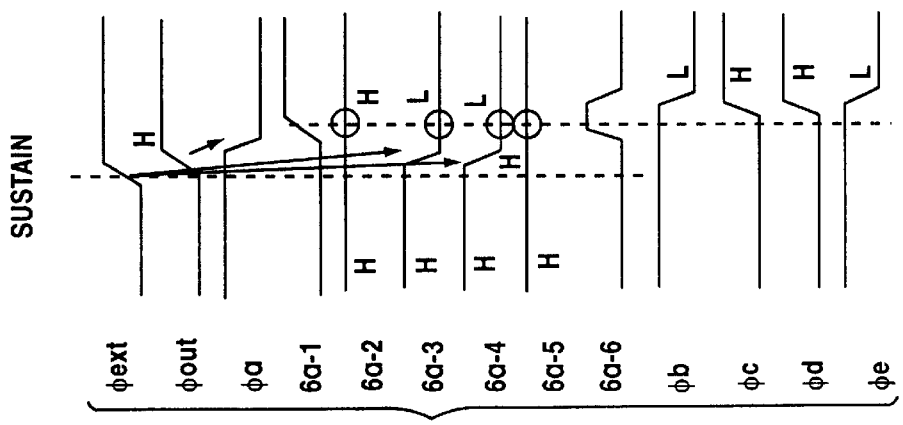
Figure 6A:
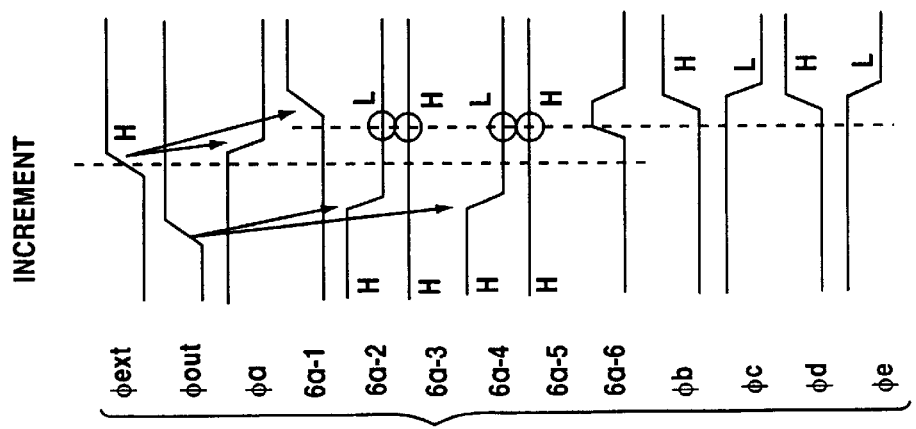

FIG. 6A shows that the phase of the dummy internal clock signal φout is ahead of the phase of the reference signal φext. Namely, the signal φout changes from low to high before the signal φext shows the same change. When the signals φout and φext are each at low level, nodes 6a-2 to 6a-5 of the flip-flops 421 and 422 are each high. When the signal φout changes from low to high, the nodes 6a-2 and 6a-4 change from high to low. Thereafter, the signal φext changes from low to high, and after one unit delay, the node 6a-1 changes from low to high. In spite of these changes, the terminal voltages of the flip-flops 421 and 422 are unchanged because they are already fixed. As a result, the node 6a-2 is continuously low, 6a-3 high, 6a-4 low, and 6a-5 high.

When the signal φext changes from low to high, the output signal φa of the generator 424 changes from high to low, to apply a high pulse to the node 6a-6. Since the node 6a-6 is connected to the NAND gates of the latches 425 and 426, the NAND gates are temporarily activated, and the latches 425 and 426 latch the terminal voltages of the flip-flips 421 and 422. As a result, the output signal φb changes to high, φc to low, φd to high, and φe to low.

FIG. 6B shows that the dummy internal clock signal φout and reference signal φext have substantially the same phase and change from low to high substantially at the same time. Within a time difference between a rise of the signal φout and a rise at the node 6a-1, the signal φout changes from low to high. At this time, the signal φext changes from low to high, so that the node 6a-3 of the flip-flop 421 changes from high to low. In the flip-flop 422, the node 6a-1 maintains low level, and the node 6a-4 changes from high to low. Thereafter, the node 6a-1 changes from low to high. At this time, the state of the flip-flop 422 is unchanged. The node 6a-6 provides a high pulse, and the latches 425 and 426 store the states. As a result, the output signal φb changes to low, φc to high, φd to high, and φe to low.

FIG. 6C shows that the phase of the dummy internal clock signal φout is behind the phase of the reference signal φext and that the signal φout changes from low to high after the same change in the signal φext. In this case, the signal φext causes changes in the flip-flops 421 and 422, and the nodes 6a-3 and 6a-5 change from high to low. As a result, the output signal φb changes to low, φc to high, φd to low, and φe to high.

In this way, a rise of the reference signal φext is used to determine whether a rise of the dummy internal clock signal φout is ahead, simultaneous, or behind. The determination is latched as values of the output signals φb, φc, φd, and φe. According to these values, it is determined to increment or decrement delays in the delay controllers 21 and 22.

Figure 8:
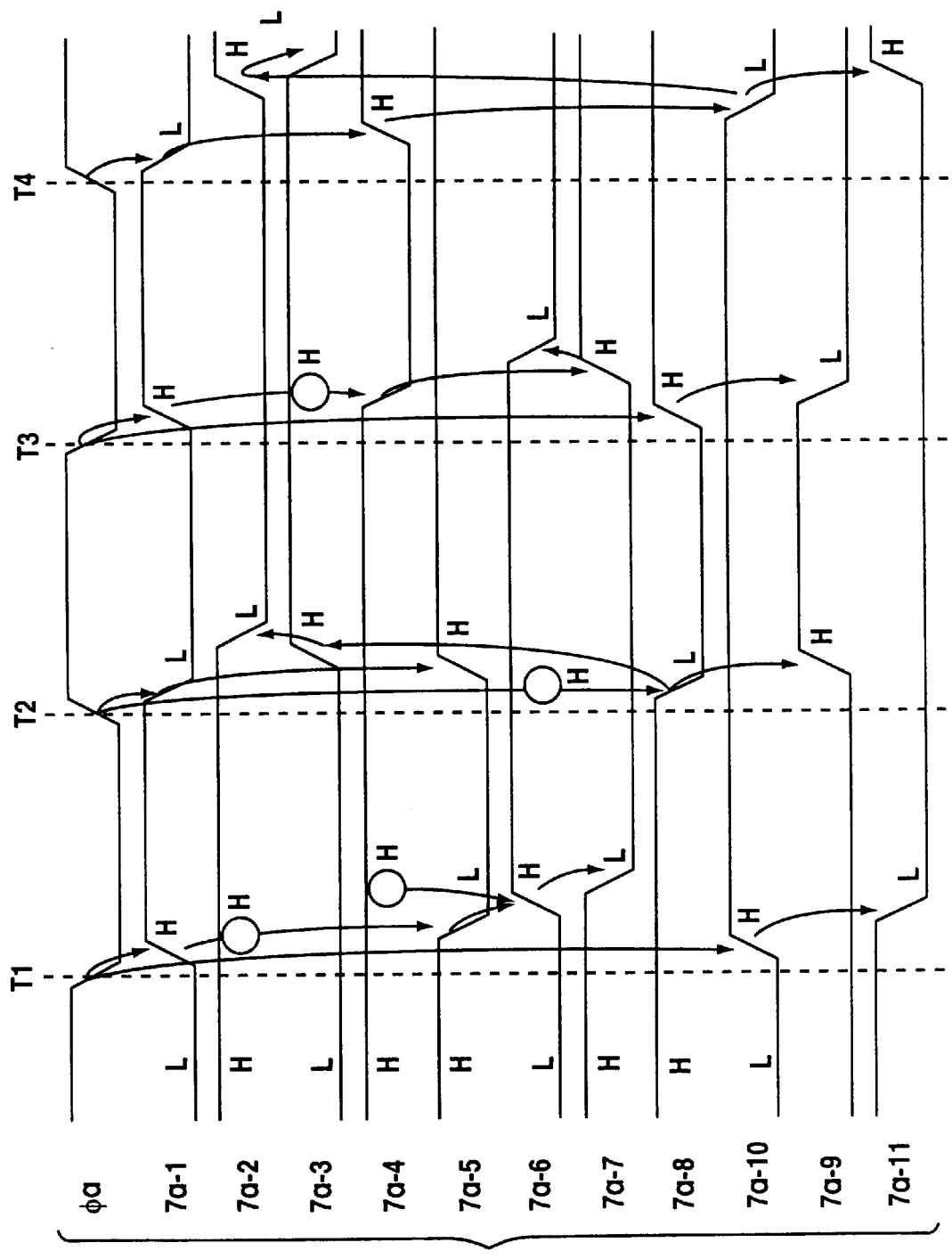
FIG. 8 is a timing chart showing the operation of a JK flip-flop of the amplifying section of FIG. 7.

FIG. 7 shows the amplifying section of the phase comparator 3 of FIG. 1, and FIG. 8 is a timing chart showing the operation of a JK flip-flop of the amplifying section.

The amplifying section has the JK flip-flop 427 and an amplifier 428 consisting of NAND gates and inverters. The JK flip-flop 427 receives the output signal φa from the phase comparing section of FIG. 5. In response to the level of the signal φa, the voltages of nodes 7a-9 and 7a-11 alternate high and low levels. The amplifier 428 receives and amplifies the outputs of the JK flip-flip 427 and the signals φb to φe.

The operation of the JK flip-flop 427 will be explained with reference to the timing chart of FIG. 8. The signal φa changes from high to low at time T1, and then, nodes 7a-1 and 7a-10 change from low to high. Nodes 7a-5, 7a-6, and 7a-7 change in response to the change at the node 7a-1, but a node 7a-8 shows no change because the signal φa is low. As a result, the output node 7a-9 is unchanged, and the output node 7a-11 changes from high to low. At time T2, the signal φa changes from low to high, and then, the node 7a-8 changes from high to low. The node 7a-10 is unchanged because the node 7a-7 is unchanged. The output node 7a-9 changes from low to high, and the output node 7a-11 is unchanged. In this way, the output nodes 7a-9 and 7a-11 of the JK flip-flop 427 alternately change from high to low and from low to high.

Figure 9:
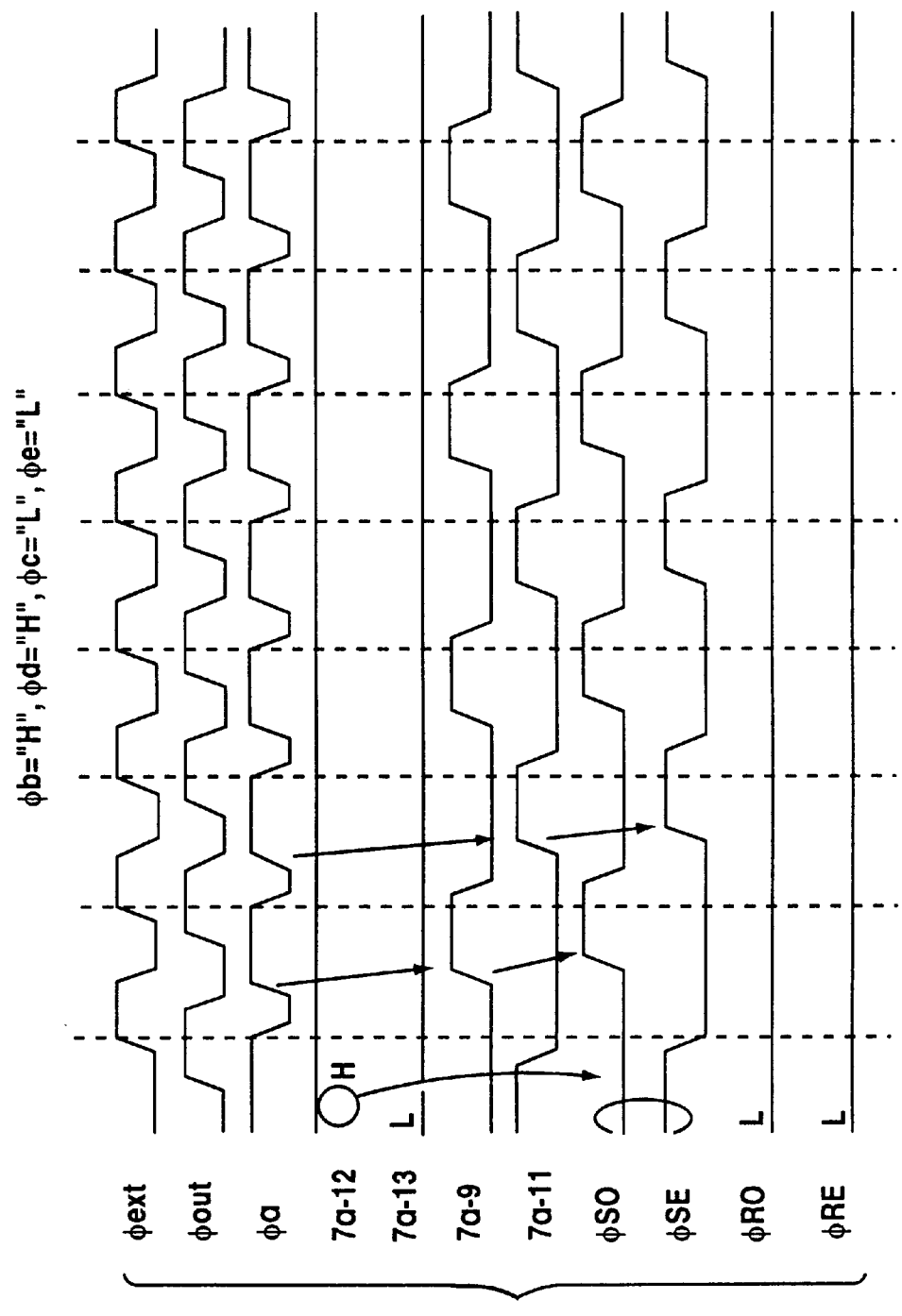
FIG. 9 is a timing chart showing an incremental operation of the amplifying section of FIG. 7.
Figure 10:
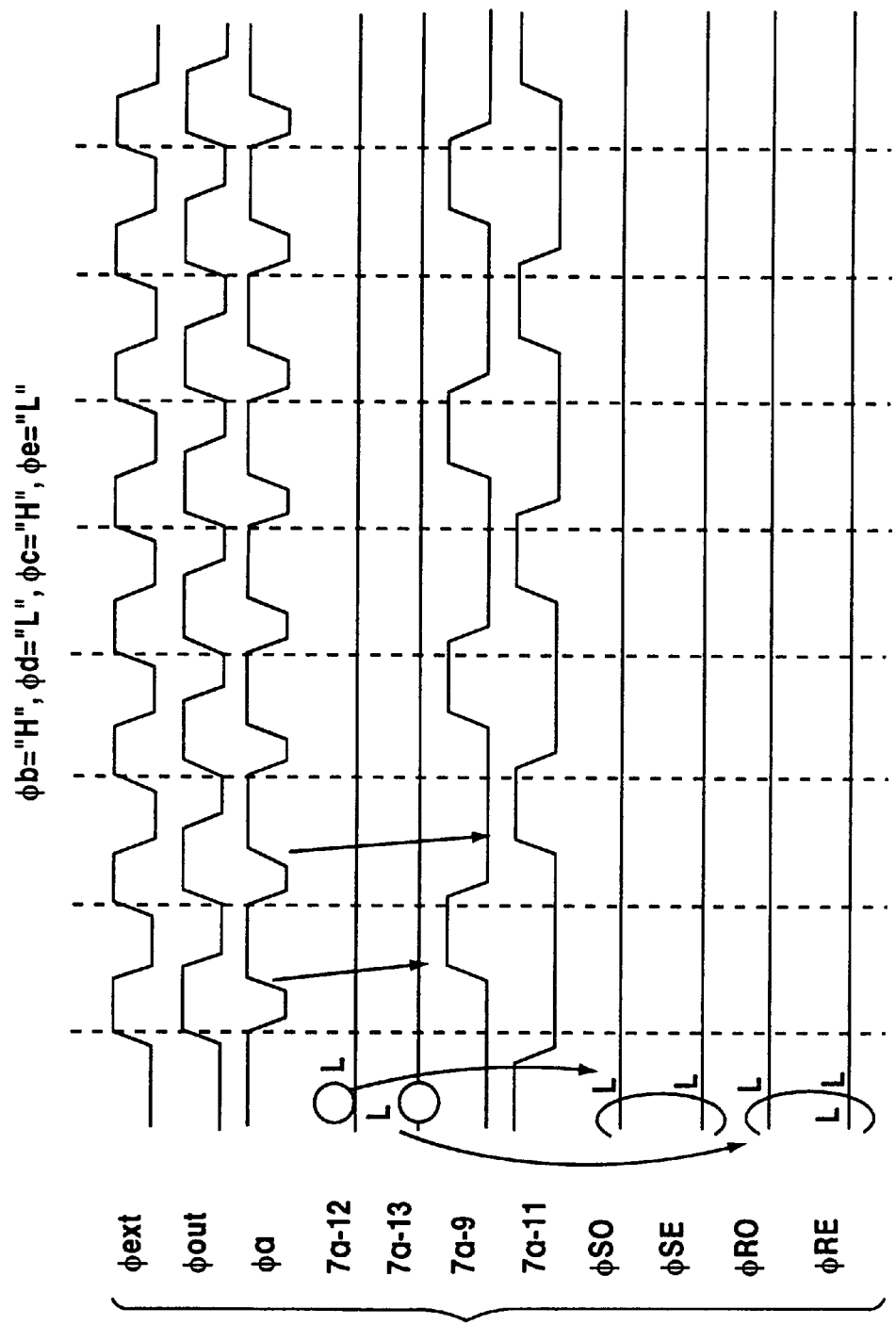
FIG. 10 is a timing chart showing a sustain operation of the amplifying section of FIG. 7.
Figure 11:
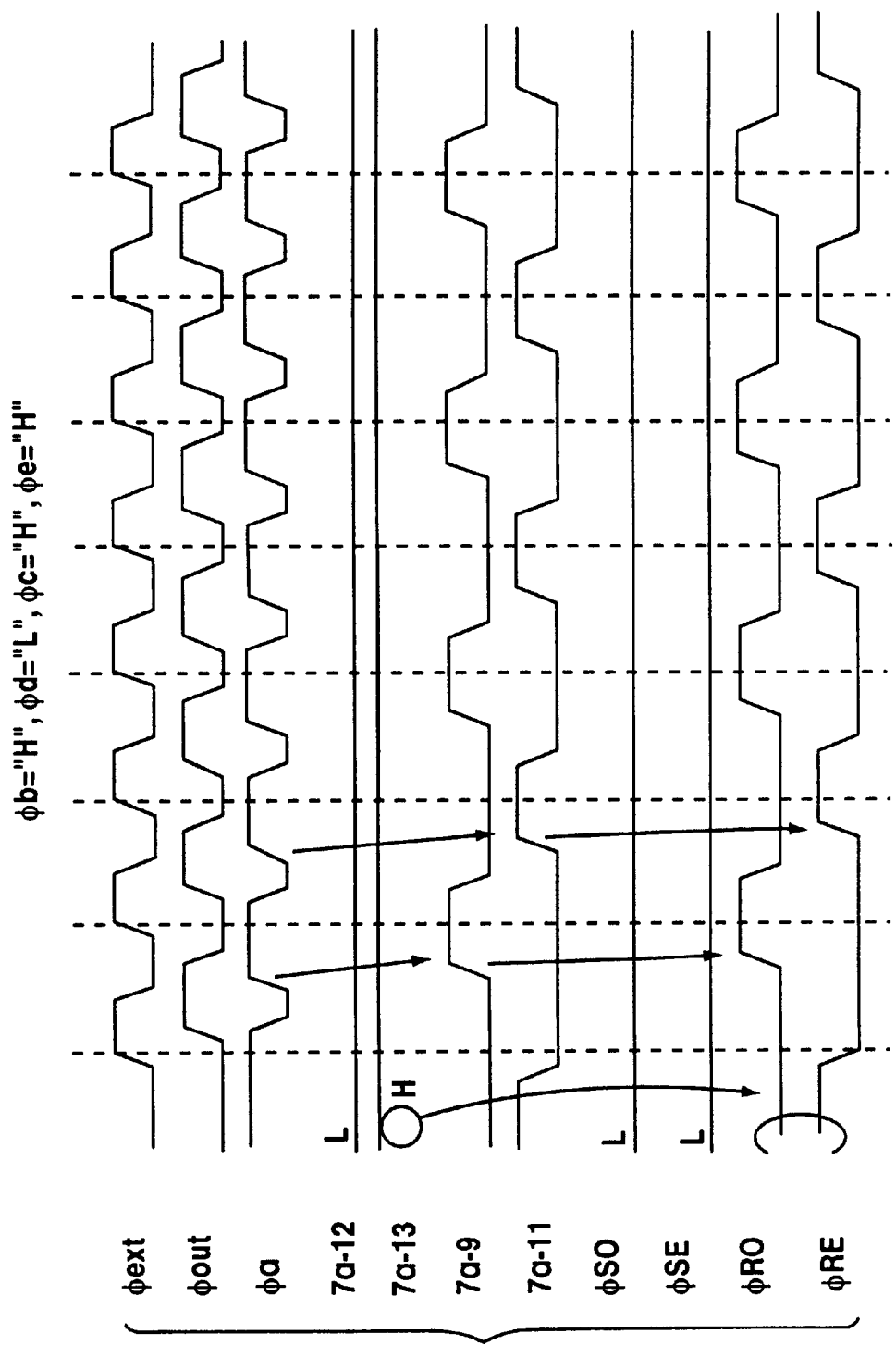
FIG. 11 is a timing chart showing a decrement operation of the amplifying section of FIG. 7.

FIG. 9 is a timing chart showing an incremental operation of the amplifying section 428 of FIG. 7 of the phase comparator 3, FIG. 10 is a timing chart showing a sustain operation of the same, and FIG. 11 is a timing chart showing a decremental operation of the same.

In FIG. 9, the dummy internal clock signal φout changes from low to high before the same change in the reference signal φext. In this case, the phase comparing section of FIG. 5 provides the signal φb of high, φc of low, φd of high, and φe of low. As a result, a node 7a-12 becomes high, and a node 7a-13 is fixed at low. Although the incremental (set) signals φSO and φSE change in response to the state of the JK flip-flop 427, the decremental (reset) signals φRO and φRE are unchanged because the node 7a-13 is low.

In FIG. 10, the signal φout changes from low to high substantially simultaneously with the reference signal φext. In this case, the phase comparing section of FIG. 5 provides the signal φb of low, φc of high, φd of high, and φe of low. As a result, the nodes 7a-12 and 7l-13 are fixed at low. The set signals φSO and φSE are not influenced by the output of the JK flip-flop, and therefore, the signals φSO, φSE, φRO, and φRE are fixed at low.

In FIG. 11, the signal φout changes from low to high behind the same change in the reference signal φext. In this case, the phase comparing section of FIG. 5 provides the signal φb of low, φc of high, φd of low, and φe of high. As a result, the node 7a-12 is fixed at low, the node 7a-13 is fixed at high, the reset signals φRO and φRE change in response to the state of the JK flip-flop, and the set signals φSO and φSE are unchanged because the node 7a-12 is low.

The DLL circuit explained above employs the delay controllers that control the number of logic gates to delay an external clock signal by one clock and provide an internal clock signal.

Figure 12:
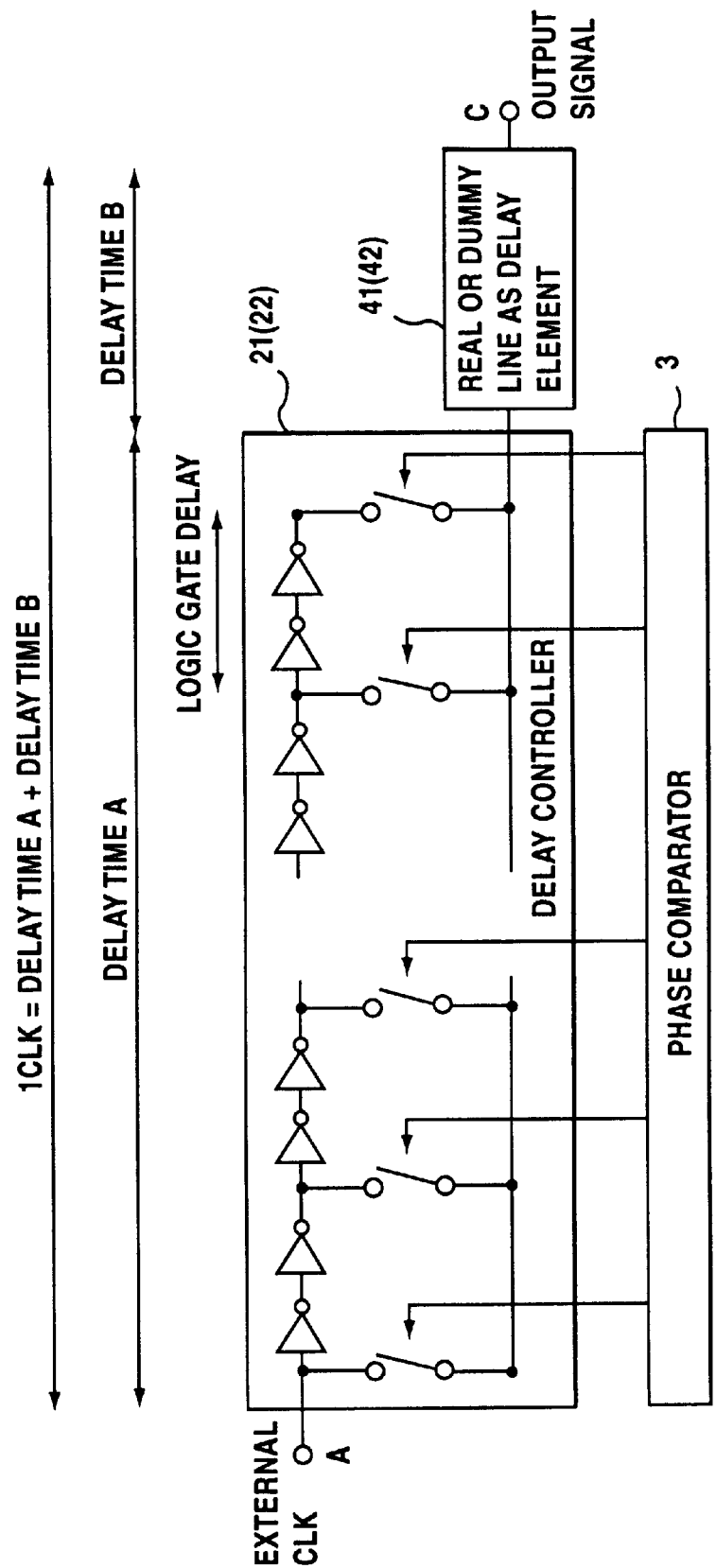
FIG. 12 explains the problem of the related art.

FIG. 12 shows a simplified model of the delay controller 21 (22) and explains the problem of the DLL circuit of the related art.

The period of the external clock signal supplied to the DLL circuit of FIG. 1 may vary depending on a user. To deal with such a variation in the period of the external clock signal, the delay controller 21 (22) must have a sufficient number of logic gates. This results in increasing the scale and area of the DLL circuit.

If the period of the external clock signal is 20 nanoseconds and a delay time between nodes A and C is 5 nanoseconds, the delay controller 21 (22) must have logic gates capable of providing a delay of at least 15 nanoseconds. If each logic gate provides (produces) a delay of 0.1 nanoseconds, the delay controller 21 (22) must have 150 logic gates to realize the delay of 15 nanoseconds.

To precisely adjust the delay achieved by the delay controller 21 (22), there must be many pointers. This may increase the scale of the circuit. In addition, the minimum resolution of the delay controller 21 (22) is limited by two logic gates. The delay controller 21 (22) is actually composed of more parts as explained with reference to FIGS. 2A to 2C and 3, to further increase the scale and area of the circuit.

Next, preferred embodiments of the present invention will be explained. The present invention is characterized by controlling a delay time by adjusting the current capacity of a power source of logic gates instead of adjusting the number of the logic gates.

Figure 13:
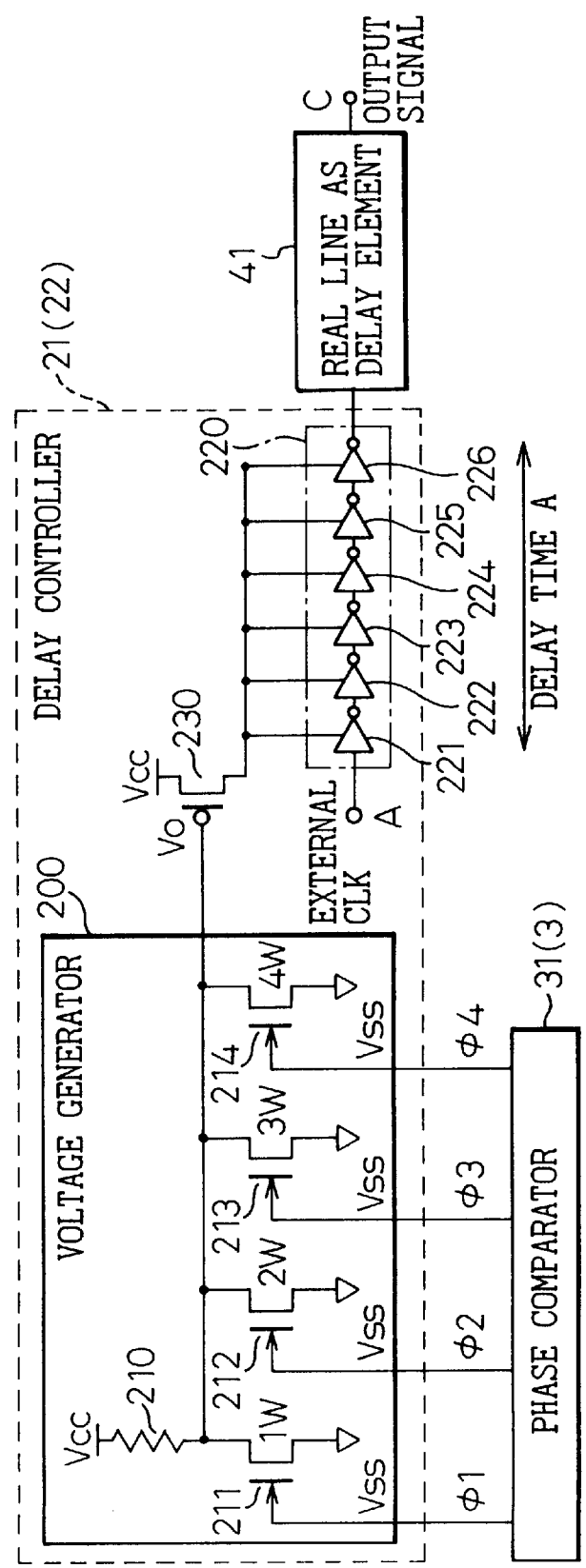
FIG. 13 is a block diagram showing a semiconductor integrated circuit according to a first embodiment of the present invention.

FIG. 13 is a block diagram showing a semiconductor integrated circuit according to an embodiment of the present invention.

The circuit has a delay controller 21 (22) that has a voltage generator 200 for generating a voltage according to (in responce to) voltage control signals φ1 to φ4 provided by a phase comparator 31 (3), a p-channel MOS transistor (p-channel type MIS transistor) 230 to which the voltage generated by the voltage generator 200 is applied, and cascaded inverters 221 to 226 serving as delay gates. Any one of the voltage control signals φ1 to φ4 becomes high with the others being low, to turn on only a corresponding one of transistors 211 to 214. The turned-on transistor and a resistor 210 divide a source voltage and provide an output voltage Vo of the voltage generator 200.

In this way, the voltage generator 200 consists of the resistor 210 and the n-channel MOS transistors (n-channel type MIS transistor) 211 to 214 having different sizes. An end of the resistor 210 is connected to a high-potential power source Vcc, and the other end thereof is commonly connected to the first electrode (drain) of each of the transistors 211 to 214. The control electrodes (gates) of the transistors 211 to 214 receive the voltage control signals φ1 to φ4, respectively, from the phase comparator 31. The second electrode (source) of each of the transistors 211 to 214 is connected to a low-potential power source Vss.

The transistors 211 to 214 have different ON resistance values. More precisely, the transistors 211 to 214 have different gate widths of 1W, 2W, 3W, and 4W that increase in geometric progression. Namely, the transistors 211 to 214 have ON resistance values R11 to R14, respectively, where R11>R12>R13>R14. The gate width 1W of the transistor 211 may be reduced and the number of the transistors may be increased. This may increase the scale of the circuit (although it is still smaller than the related art of FIG. 12) but may improve a resolution in adjusting a delay time.

The first electrode (drain) of the transistor 230 is connected to the high-potential terminals of the inverters 221 to 226, and the second electrode (source) thereof is connected to the high-potential power source Vcc. The control electrode (gate) of the transistor 230 receives the output voltage Vo of the voltage generator 200. In response to the voltage Vo, the transistor 230 controls a current supplied to an array 220 of the cascaded inverters 221 to 226. As the voltage applied to the gate of the transistor 230 increases, a current passing through the transistor 230 becomes smaller, and then, a time for charging and discharging each inverter gate elongates. Namely, the driving capacity of the inverter array (delay gate array) 220 drops to extend a delay time.

Figure 14:
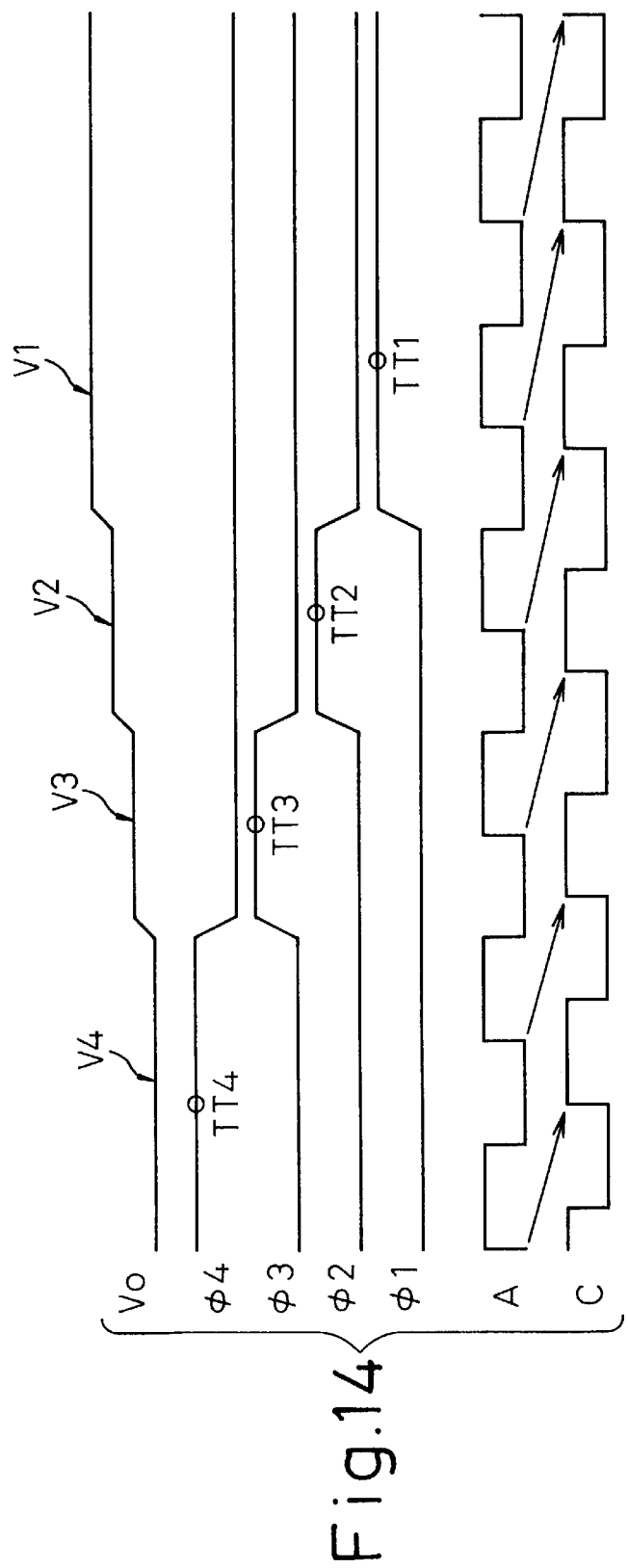
FIG. 14 is a timing chart showing the operation of the circuit of FIG. 13.

FIG. 14 is a timing chart showing the operation of the circuit of FIG. 13.

If the signal φ1 among the voltage control signals φ1 to φ4 from the phase comparator 31 is high and the others are each low as indicated with a reference mark TT1, only the transistor 211 having the narrowest gate width of 1W, i.e., the largest ON resistance is turned on. The ON resistance R11 of the transistor 211 and the resistor 210 divide the source voltage, and the voltage generator provides a voltage V1 as the output voltage Vo. Similarly, the signals φ2, φ3, and φ4 from the phase comparator 31 turn on the transistors 212, 213, and 214 as indicated with reference marks TT2, TT3, and TT4, respectively, so that the voltage generator 200 may provide, as the output voltage Vo, voltages V2, V3, and V4, respectively.

Since the ON resistance values R11 to R14 of the transistors 211 to 214 are R11>R12>R13>R14 due to the gate widths 1W to 4W of the transistors, the voltages V1 to V4 generated by the voltage generator 200 are V1>V2>V3>V4. As the voltage applied to the gate of the p-channel MOS transistor 230 increases, the current passing through the transistor decreases to increase a delay time achieved by the inverter array 220. In FIG. 14, the phase of an external clock signal to a node A is in synchronization with and one-clock-period ahead of the phase of an internal clock signal provided from a node C through a real line 41, if the transistor 211 having the largest ON resistance is selected.

In this way, the differences among the ON resistance values of the transistors 211 to 214 of the voltage generator 200 determine a delay controlling resolution. These differences, the number of the transistors in the voltage generator 200, and the number of the inverters in the inverter array 220 are determined depending on requirements.

The first embodiment of the present invention controls the transistors having different ON resistance values in the voltage generator 200 according to the output signals φ1 to φ4 of the phase comparator 31, thereby adjusting the output voltage Vo of the voltage generator 200. The first embodiment applies the output voltage Vo to the gate of the transistor 230 that supplies a current to the delay gate array 220, thereby controlling a delay time achieved by the delay gate array 220. Namely, the first embodiment controls the delay time irrespective of the number of logic gates in the delay gate array 220, to reduce a circuit scale and a circuit area. Also, the first embodiment can set a minimum resolution independently of a gate delay.

The semiconductor integrated circuit of the first embodiment is applicable as it is to the phase comparator 3 and delay controllers 21 and 22 of FIG. 1.

Figure 15:
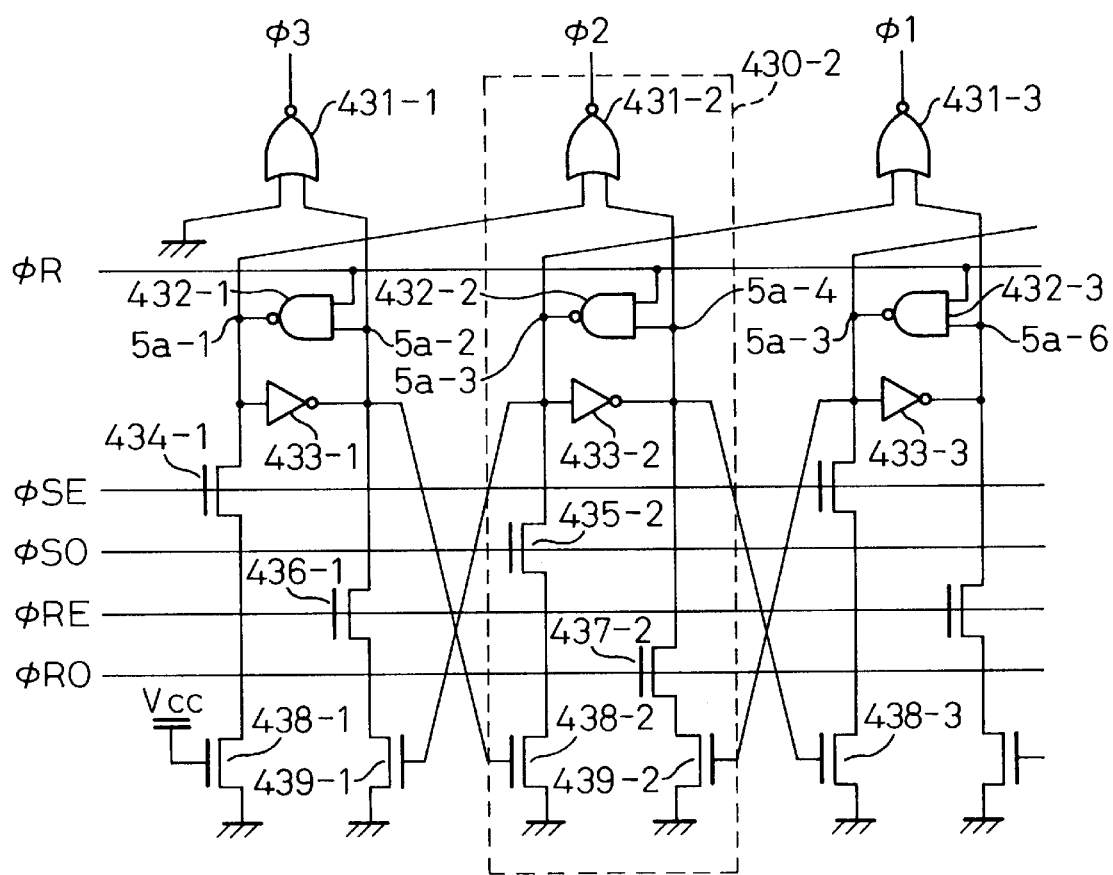
FIG. 15 is a circuit diagram showing a control section of a delay controller of the circuit of FIG. 13.

FIG. 15 is a circuit diagram showing a control section of the delay controller 21 (22) of FIG. 13 according to the present invention and corresponds to FIG. 3.

Unlike the circuit of FIG. 3 that determines a delay time by controlling the number of gates according to the enable signals φE-1, φE-2, and φE-3, the present invention of FIG. 15 provides the voltage control signals φ1 to φ4 (only φ1 to φ3 are shown in FIG. 15) to select one of the transistors 211 to 214 of the voltage generator 200 of FIG. 13, to control the output voltage Vo of the voltage generator 200. The structure of the control section of FIG. 15 itself is the same as that of FIG. 3. Although FIG. 15 shows elements to provide the voltage control signals φ1 to φ3, the voltage control signal φ4 of FIG. 13 and many other control signals may be provided in the same way.

The control section of FIG. 15 consists of a required number of 1-bit control elements among which one surrounded with a dotted line is a 1-bit control element 430-2. The elements provide the voltage control signals such as φ1 to φ3 to the gates of the transistors 211 to 213 of the voltage generator 200 of FIG. 13.

The 1-bit control element 430-2 consists of a flip-flop having a NAND gate 432-2 and an inverter 433-2, transistors 435-2, 438-2, 437-2, and 439-2, and a NOR gate 431-2. The gate of the transistor 438-2 is connected to a node 5a-2 of a front 1-bit control element. The gate of the transistor 439-2 is connected to a node 5a-5 of a rear 1-bit control element. Incremental signals, i.e., set signals φSE and φSO and decremental signals, i.e., reset signals φRE and φRO are connected alternately to the 1-bit control elements.

In the 1-bit control element 430-2, the gate of the transistor 435-2 receives the set signal φSO, and the gate of the transistor 437-2 receives the reset signal φRO. The gates of other transistors of the front and rear 1-bit control elements receive the set signal φSE and reset signal φRE. The NOR gate 431-2 receives a signal from a node 5a-1 of the front element and a signal from a node 5a-4 of its own. A signal φR resets the delay controller 21 (22). The signal φR is once set to low when a power source is turned on and is fixed to high thereafter.

Figure 16:
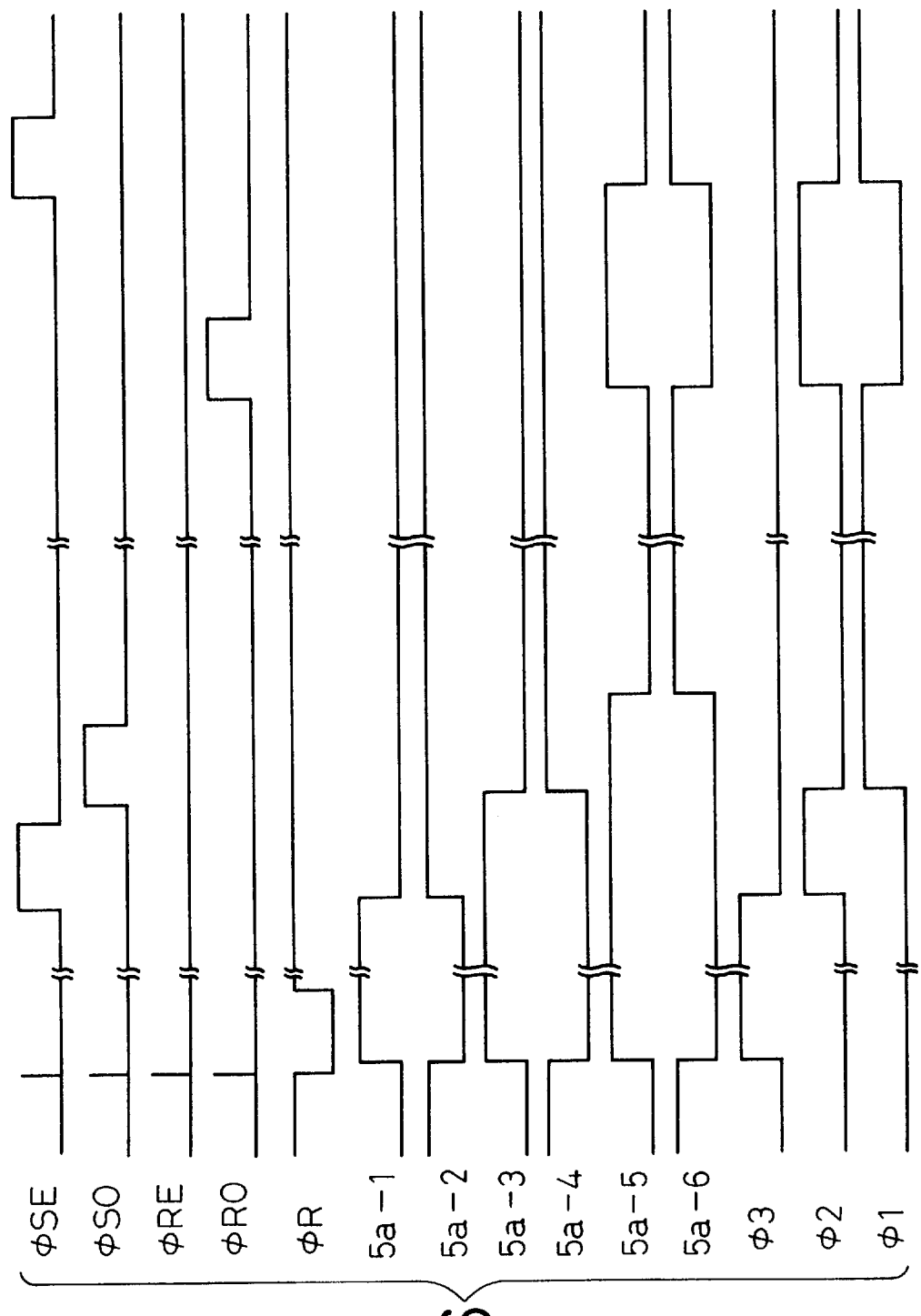
FIG. 16 is a timing chart showing the operation of the control section of FIG. 15.

FIG. 16 is a timing chart showing the operation of the circuit of FIG. 15.

The reset signal φR is once set to low so that the nodes 5a-1, 5a-3, and 5a-5 are set to high and the nodes 5a-2, 5a-4, and 5a-6 to low. To carry out an incremental operation, the incremental signals, i.e., the set signals φSE and φSO are set to high and low alternately.

When the set signal φSE is changed from low to high, the node 5a-1 is grounded to low, and the node 5a-2 is changed to high. Accordingly, the voltage control signal φ3 changes from high to low. This state is latched by the flip-flop, and therefore, the voltage control signal φ1 keeps low level even if the set signal φSE returns to low. When the node 5a-1 changes to low, the voltage control signal φ2 changes from low to high. When the node 5a-2 changes to high, the transistor 438-2 is turned on. When the set signal φSO changes from low to high, the node 5a-3 is grounded to low, and the node 5a-4 changes to high. As a result, the voltage control signal φ2 changes from high to low. This state is latched by the flip-flop, and therefore, the voltage control signal φ2 keeps the low level even if the set signal φSO returns to low.

When the node 5a-3 changes to low, the voltage control signal φ1 changes from low to high. Although FIG. 16 shows each one pulse of the set signals φSE and φSO, many 1-bit control elements are connected to one another in reality.

Accordingly, if the set signals φSE and φSO are alternately set to high and low, the 1-bit control element that provides a voltage control signal of high level will shift to the right sequentially.

If the phase comparator 31 determines that a delay must be increased, the set signals φSE and φSO will alternately be set to high and low. For example, a high level state may be changed from the voltage control signal φ3 to the voltage control signal φ1. Then, the output voltage Vo of the voltage generator 200 increases accordingly. This results in increasing the gate voltage of the p-channel MOS transistor 230, to drop a current passing through the transistor 230. This results in decreasing a current flowing to the inverters of the delay gate array 220, to extend a time for charging and discharging the gates, thereby extending a delay time.

When the incremental (set) signals φSE and φSO and decremental (reset) signals φRE and φRO are kept low, the 1-bit control element that provides a voltage control signal of high level is fixed. Accordingly, if the phase comparator 31 determines to keep a delay, the signals φSE, φSO, φRE, and φRO are held low.

When carrying out a decremental operation, the reset signals φRE and φRO are alternately provided so that the 1-bit control element that provides the voltage control signal of high level may shift to the left sequentially.

In this way, the control section of FIG. 15 shifts the 1-bit control element that provides a voltage control signal of high level element by element, to control the transistors 211 to 213 of the voltage generator 200, thereby controlling a delay achieved by the delay gate array 220 of FIG. 13 The control section of FIG. 15 is incorporated in the phase comparator 31 of FIG. 13.

Figure 17:
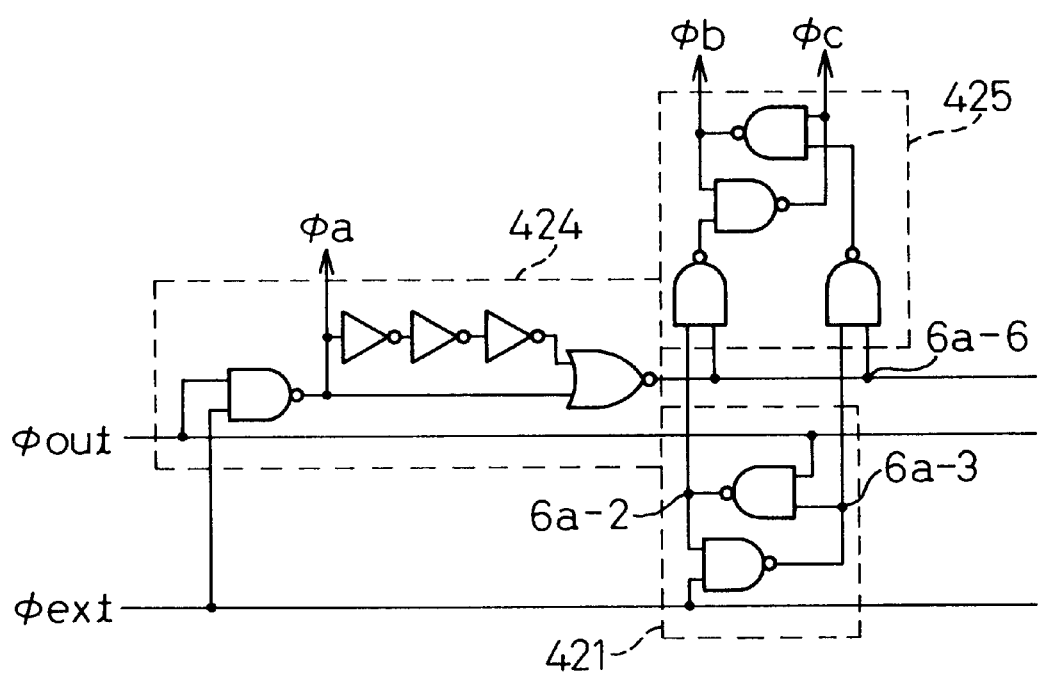
FIG. 17 is a circuit diagram showing a phase comparing section of a phase comparator of the circuit of FIG. 13.
Figure 18B:
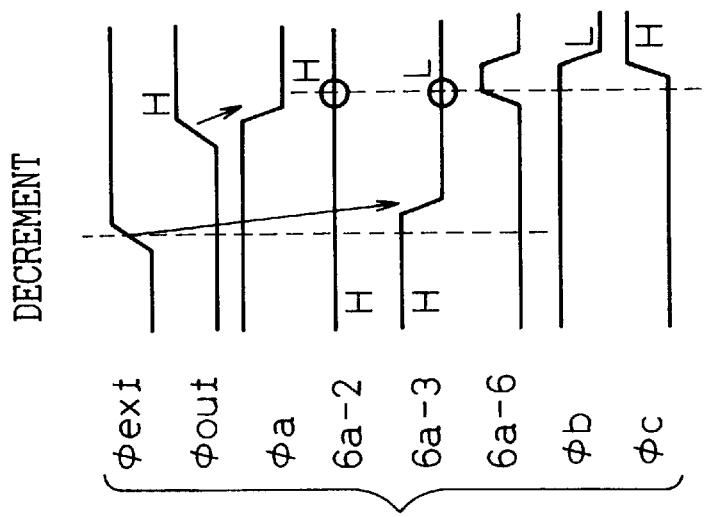
FIGS. 18A and 18B are timing charts showing the operation of the phase comparing section of FIG. 17.
Figure 18A:
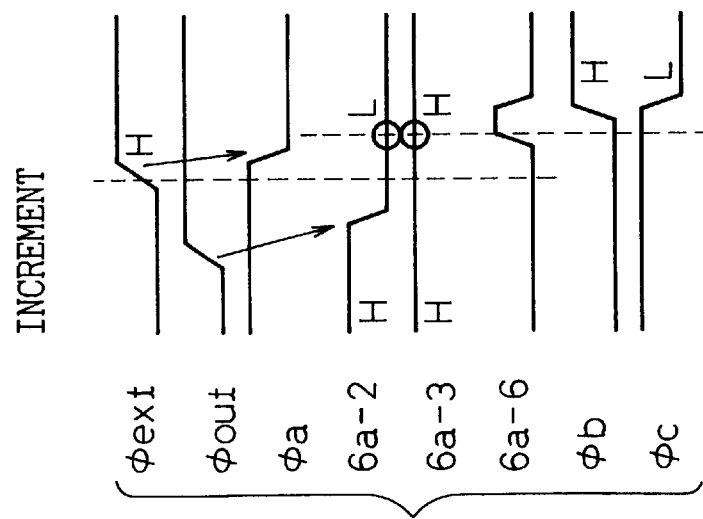

FIG. 17 shows a phase comparing section of the phase comparator 31 of FIG. 13, and FIGS. 18A and 18B are timing charts showing the operation of the phase comparing section.

Figure 19:
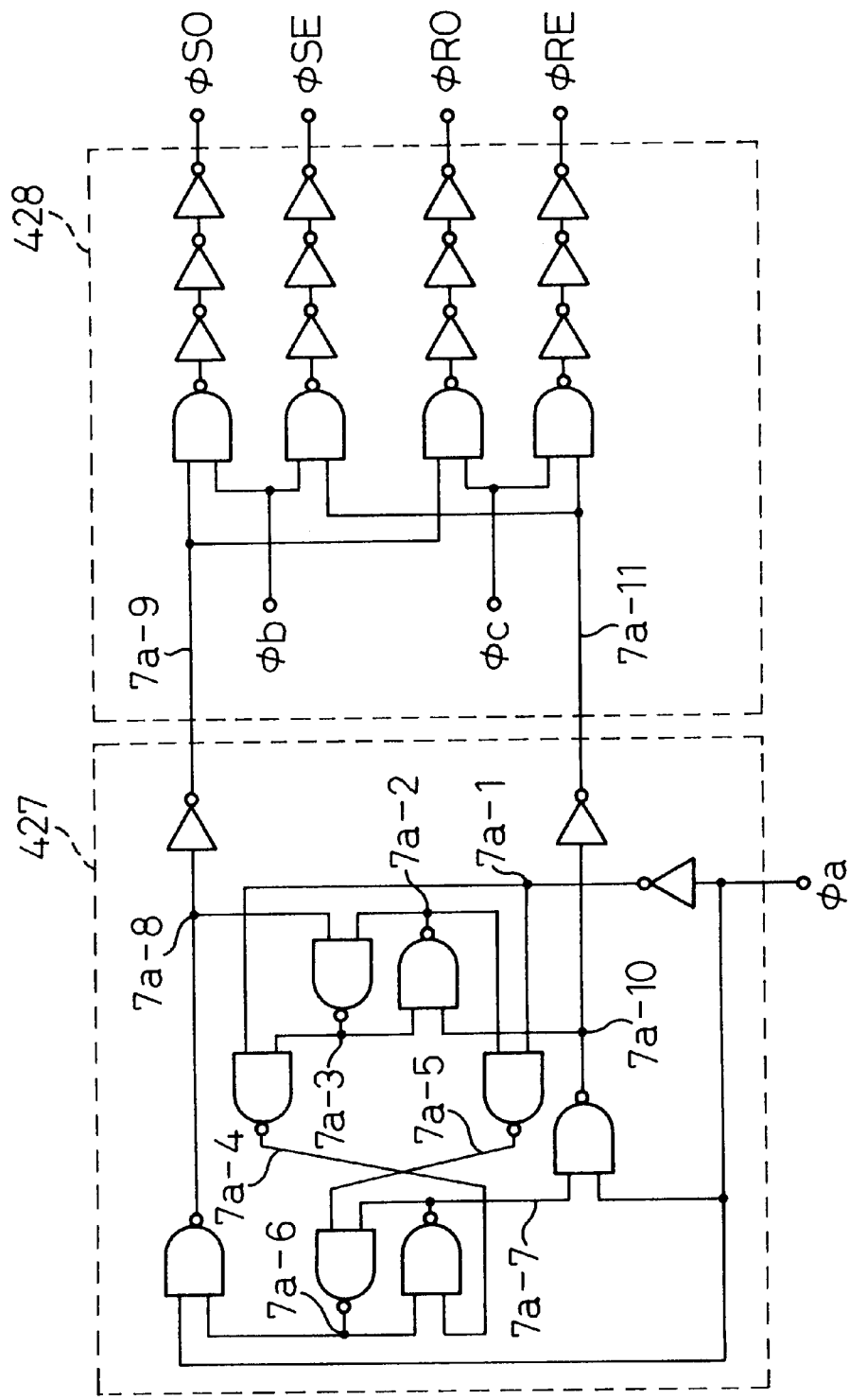
FIG. 19 is a circuit diagram showing an amplifying section of the phase comparator of the circuit of FIG. 13.

The phase comparator 31 consists of the phase comparing section of FIG. 17 and an amplifying section of FIG. 19.

In FIG. 17, the phase comparing section compares a dummy internal clock signal φout with an external clock signal φext serving as a reference signal. Output signals φa to φc are transferred to the amplifying section. The circuit of FIG. 17 is not provided with the flip-flop 422, delay circuit 423, and latch 426 of FIG. 5.

The phase comparing section is composed of a flip-flop 421 having two NAND gates, a latch 425 for latching the state of the flip-flop 421, and a generator 424 for generating an activation signal for the latch 425.

FIG. 18A shows that the phase of the dummy internal clock signal φout is ahead of the phase of the reference signal φext. Namely, the signal φout changes from low to high before the signal φext shows the same change. When the signals φout and φext are each at low level, nodes 6a-2 and 6a-3 of the flip-flop 421 are each high. When the signal φout changes from low to high, the node 6a-2 changes from high to low. Thereafter, the signal φext changes from low to high. In spite of this, the terminal voltage of the flip-flop 421 is unchanged because it is already fixed. As a result, the node 6a-2 is continuously low and 6a-3 high.

When the signal φext changes from low to high, the output signal φa of the generator 424 changes from high to low, to apply a high pulse to the node 6a-6. Since the node 6a-6 is connected to the NAND gates of the latch 425, the NAND gates are temporarily activated, and the latch 425 latches the terminal voltage of the flip-flip 421. As a result, the output signal φb changes to high and φc to low.

FIG. 18B shows that the phase of the dummy internal clock signal φout is behind the phase of the reference signal φext and that the signal φout changes from low to high after the same change in the signal φext. In this case, the signal φext causes changes in the flip-flop 421, and the node 6a-3 changes from high to low. As a result, the output signal φb changes to low and φc to high.

In this way, a rise of the reference signal φext is used to determine whether a rise of the dummy internal clock signal φout is ahead or behind. The determination is latched as values of the output signals φb and φc. According to these values, it is determined to increment or decrement delays in the delay controllers 21 and 22.

Figure 20:
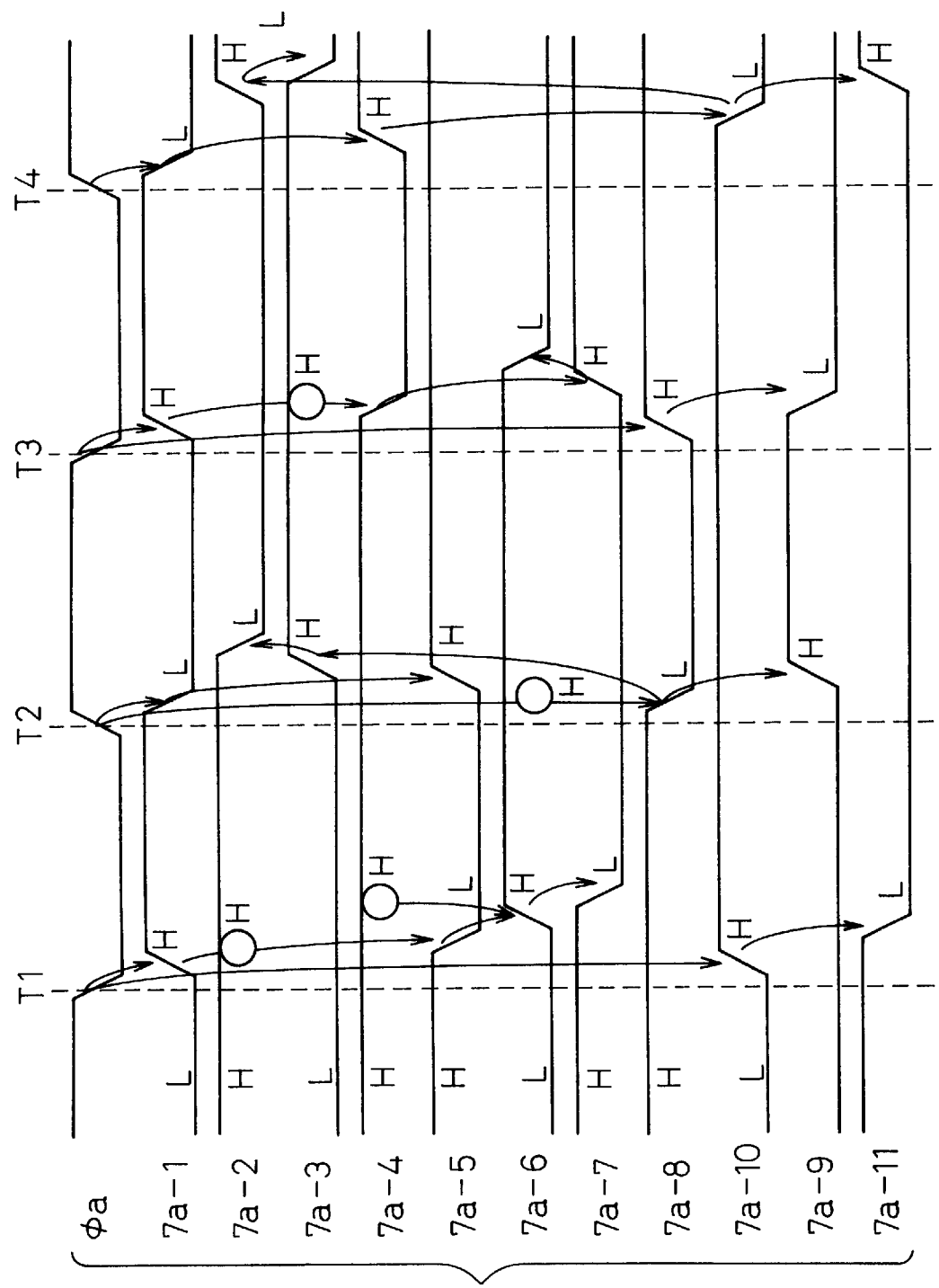
FIG. 20 is a timing chart showing the operation of a JK flip-flop of the amplifying section of FIG. 19.

FIG. 19 shows the amplifying section of the phase comparator 31 of FIG. 13, and FIG. 20 is a timing chart showing the operation of a JK flip-flop of the amplifying section.

The amplifying section has the JK flip-flop 427 and an amplifier 428 consisting of NAND gates and inverters. The JK flip-flop 427 receives the output signal φa from the phase comparing section of FIG. 17. In response to the level of the signal φa, the voltages of nodes 7a-9 and 7a-11 alternate high and low levels. The amplifier 428 receives and amplifies the outputs of the JK flip-flip 427 and the signals φb and φc.

The operation of the JK flip-flop 427 will be explained with reference to the timing chart of FIG. 20. The signal φa changes from high to low at time T1, and then, nodes 7a-1 and 7a-10 change from low to high. Nodes 7a-5, 7a-6, and 7a-7 change in response to the change at the node 7a-1, but a node 7a-8 shows no change because the signal φa is low. As a result, the output node 7a-9 is unchanged, and the output node 7a-11 changes from high to low. At time T2, the signal φa changes from low to high, and then, the node 7a-8 changes from high to low. The node 7a-10 is unchanged because the node 7a-7 is unchanged. The output node 7a-9 changes from low to high, and the output node 7a-11 is unchanged. In this way, the output nodes 7a-9 and 7a-11 of the JK flip-flop 427 alternately change from high to low and from low to high.

Figure 21:
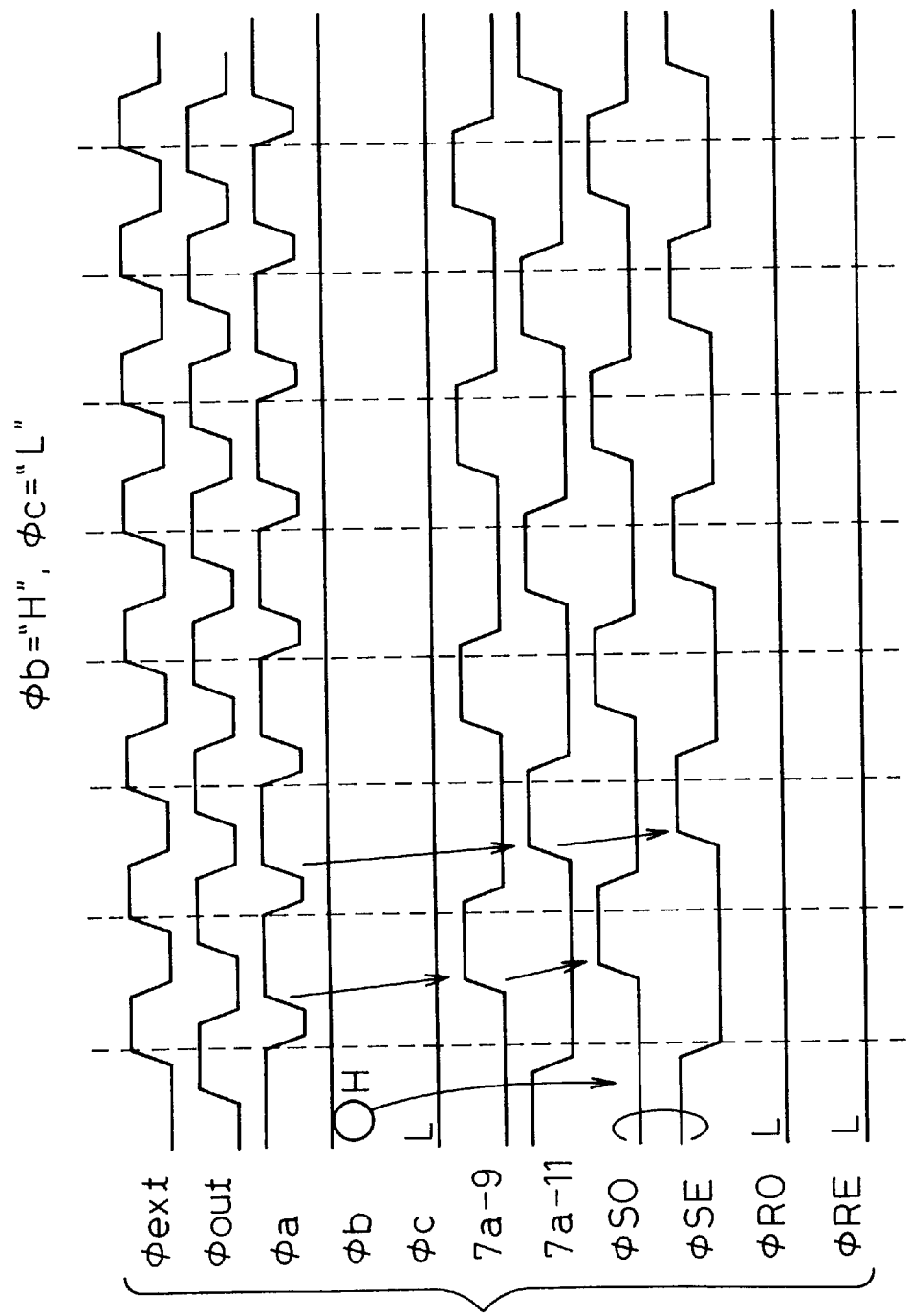
FIG. 21 is a timing chart showing an incremental operation of the amplifying section of FIG. 19.
Figure 22:
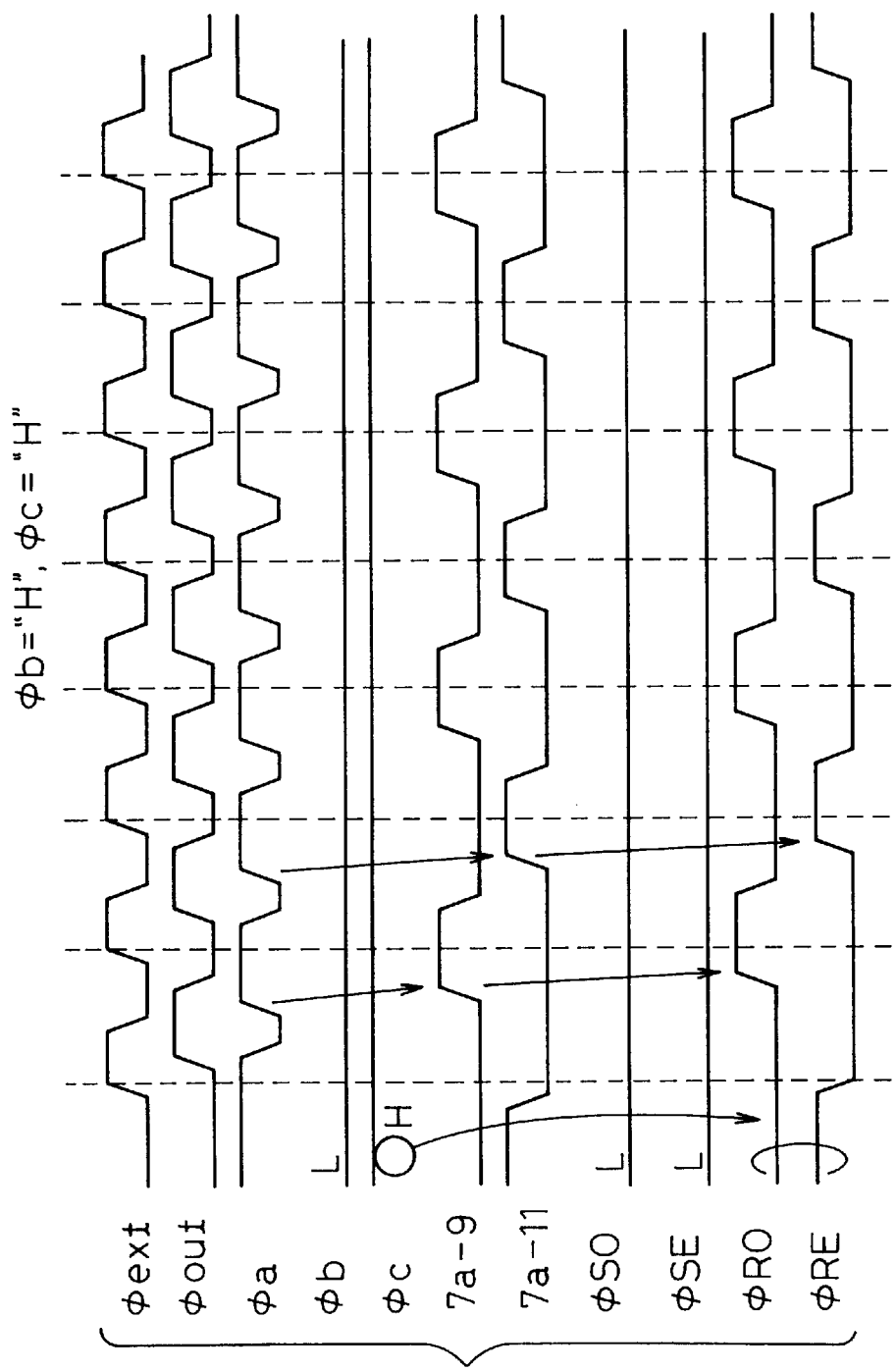
FIG. 22 is a timing chart showing a decremental operation of the amplifying section of FIG. 19.

FIG. 21 is a timing chart showing an incremental operation of the amplifying section 428 of FIG. 19 of the phase comparator 31, and FIG. 22 is a timing chart showing a decremental operation of the same.

In FIG. 21, the dummy internal clock signal φout changes from low to high before the same change in the reference signal φext. In this case, the phase comparing section of FIG. 17 provides the signal φb of high and φc of low. Although the incremental (set) signals φSO and φSE change in response to the state of the JK flip-flop 427, the decremental (reset) signals φRO and φRE are unchanged because the signal φc is low.

In FIG. 22, the signal φout changes from low to high behind the same change in the reference signal φext. In this case, the phase comparing section of FIG. 17 provides the signal φb of low and φc of high. As a result, the reset signals φRO and φRE change in response to the state of the JK flip-flop, and the set signals φSO and φSE are unchanged because the signal φb is low.

Figure 23:
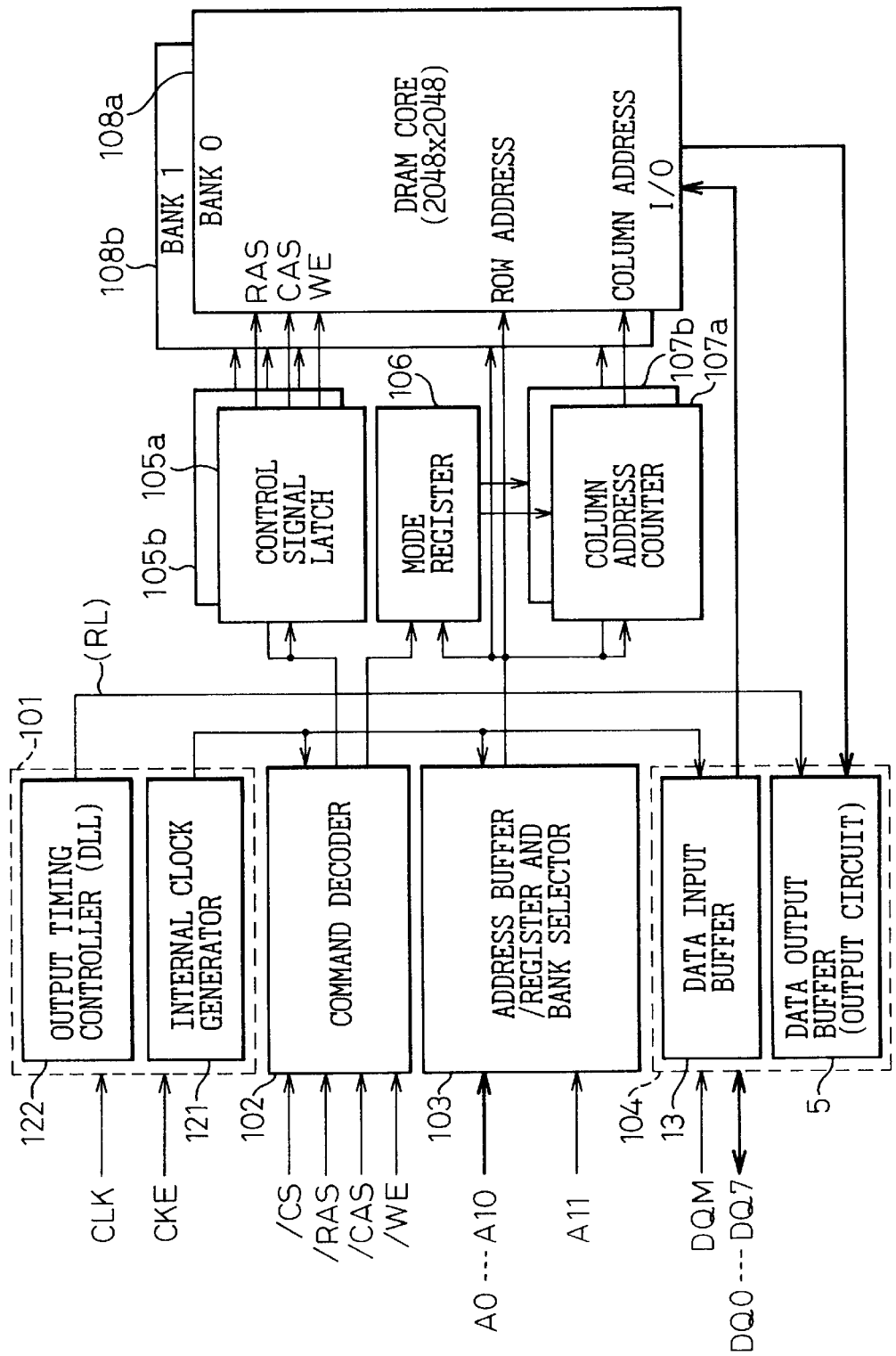
FIG. 23 is a block diagram showing an SDRAM according to the present invention.
Figure 24:
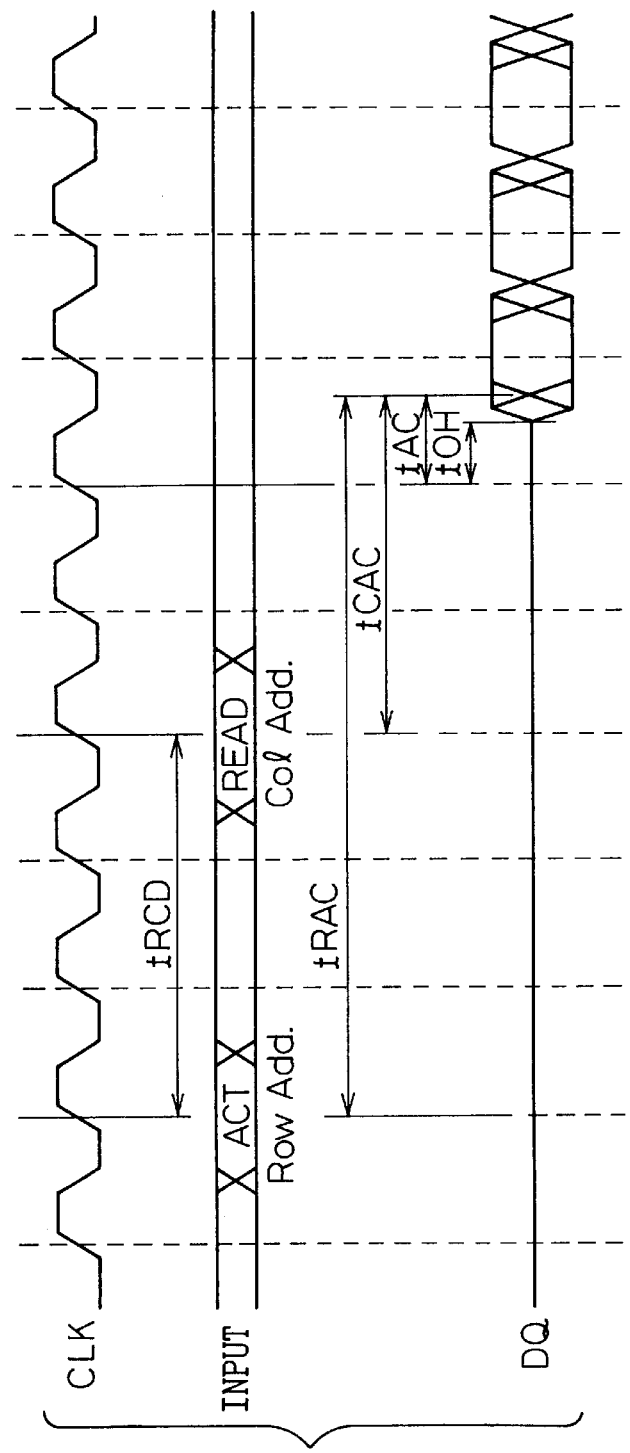
FIG. 24 is a timing chart showing the operation of the SDRAM of FIG. 23.

FIG. 23 shows an SDRAM employing a DLL circuit according to the present invention, and FIG. 24 is a timing chart showing the operation of the SDRAM.

The SDRAM employs a pipeline method and is a 2-bank, 8-bit, 16-M SDRAM.

The SDRAM has DRAM cores 108a and 108b, a clock buffer 101, a command decoder 102, an address buffer/ register and bank address selector 103, an I/O data buffer/ register 104, control signal latches 105a and 105b, a mode register 106, and column address counters 107a and 107b. Signals /CS, /RAS, /CAS, and /WE are combined to form a command that specifies an operation mode. The command is decoded by the command decoder 102, and according to a mode specified by the command, circuits are controlled. The signals /CS, /RAS, /CAS, and /WE are also supplied to the latches 105a and 105b that maintain their states until the next command is provided.

Address signals are amplified by the address buffer 103, which provides row addresses for the banks as well as initial addresses for the column address counters 107a and 107b.

The clock buffer 101 has an internal clock generator 121 and an output timing controller 122, which is the DLL circuit of the present invention. The internal clock generator 121 generates an ordinary internal clock signal according to an external clock signal CLK. The output timing controller 122 generates a delay-locked (phase-locked) clock signal after carrying out the delay control of the present invention mentioned above.

The register 104 has a data input buffer 13 and a data output circuit 5 including output circuits 50 to 57. The data output circuit 5 amplifies data read out of the DRAM cores 108a and 108b and provides the data through output pads DQ0 to DQ7 according to the delay-locked clock signal provided by the output timing controller 122. Input data to the pads DQ0 to DQ7 are received by the data input buffer 13. A real line to which the present invention is applied runs between the output timing controller 122 and the data output circuit 5.

FIG. 24 shows a read operation of the SDRAM.

The external clock signal CLK is supplied from a system to the SDRAM. In synchronization with a rise of the clock signal CLK, the SDRAM reads commands, address signals, and input data and provides output data.

When reading data out of the SDRAM, the command signals /CS, /RAS, /CAS, and /WE are combined to form an active command (ACT), which is supplied to a command terminal. At the same time, a row address signal is supplied to an address terminal. Then, the SDRAM is activated to select a word line corresponding to the row address, provides corresponding cell data to a corresponding bit line, and amplifies the data by a sense amplifier.

After an operation time tRCD related to the row address, a read command and a column address are supplied to the SDRAM. The SDRAM selects sense amplifier data according to the column address, supplies the data to a data bus line, amplifies the data by a data bus amplifier, further amplifies the data by the output buffer, and transfers the data to the output terminal DQ. These operations are the same as those in a standard DRAM. In the SDRAM, circuits related to a column address carry out a pipeline operation, and read data is continuously provided. Accordingly, a data transfer speed is determined by the period of the external clock signal.

The SDRAM involves three kinds of access time each of which is defined according to a rise of the clock signal CLK. In FIG. 24, there are row address access time tRAC, column address access time tCAC, and clock signal access time tAC. When the SDRAM is used in a high-speed memory system, tRAC and tCAC are important because they determine a period between command input and first data output. The clock signal access time tAC is also important.

Figure 25:
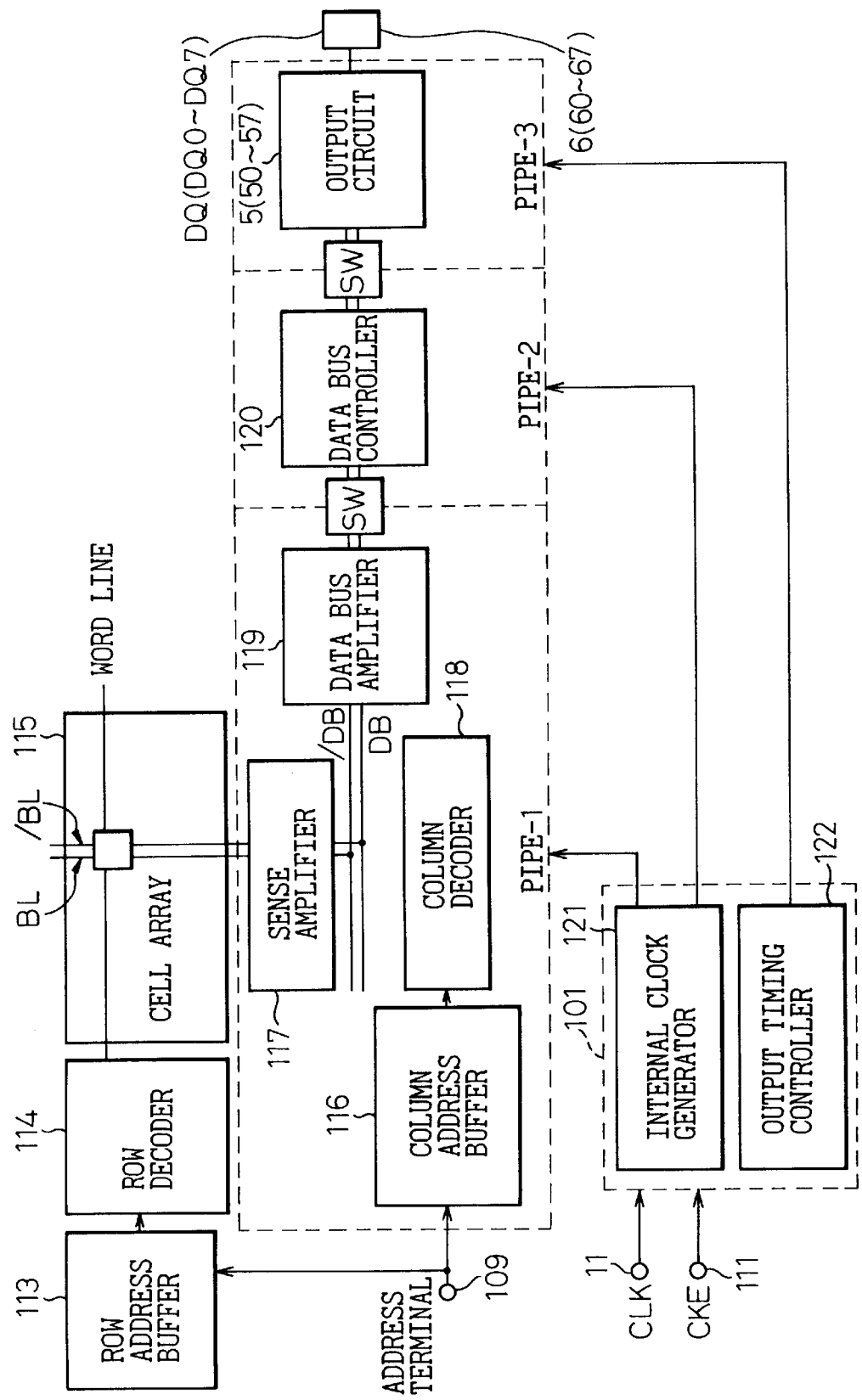
FIG. 25 is a block diagram showing essential parts of the SDRAM of FIG. 23.

FIG. 25 is a block diagram showing essential parts of the SDRAM of FIG. 23 and explains a pipeline operation thereof with, for example, three pipes.

The circuit for processing a column address in the SDRAM is divided into several sections along a processing flow. Each of the divided sections is called a pipe.

As explained with reference to FIG. 23, the buffer 101 has the internal clock generator 121 and output timing controller 122. The internal clock generator 121 generates an ordinary internal clock signal, which is supplied to the pipes 1 and 2. The output timing controller 122 provides a delay-locked (phase-locked) internal clock signal to the output circuit 5 (data output circuits 50 to 57) of the pipe 3.

The supplied internal clock signals control the corresponding pipes. Between the pipes, there is a switch for controlling the transmission timing of a signal between the pipes. These switches are controlled according to the internal clock signal generated by the generator 121.

In the pipe 1, a column address buffer 116 amplifies an address signal and sends it to a column decoder 118. The column decoder 118 selects an address. Data at the address is amplified by a sense amplifier 117 and then is supplied to a data bus. The data on the data bus is amplified by a data bus amplifier 119. The pipe 2 involves only a data bus controller 120. The pipe 3 involves the I/O buffer 104 (output circuit 5). The data input buffer 13 in the I/O buffer 104 is not shown in FIG. 25.

The circuit(s) in each pipe completes its operation within a clock cycle, and the switch between the pipes is opened and closed in synchronization with the clock signal, to relay data. As a result, the pipes process data in parallel, and data is continuously sent to the output terminal in synchronization with the clock signal.

Figure 26:
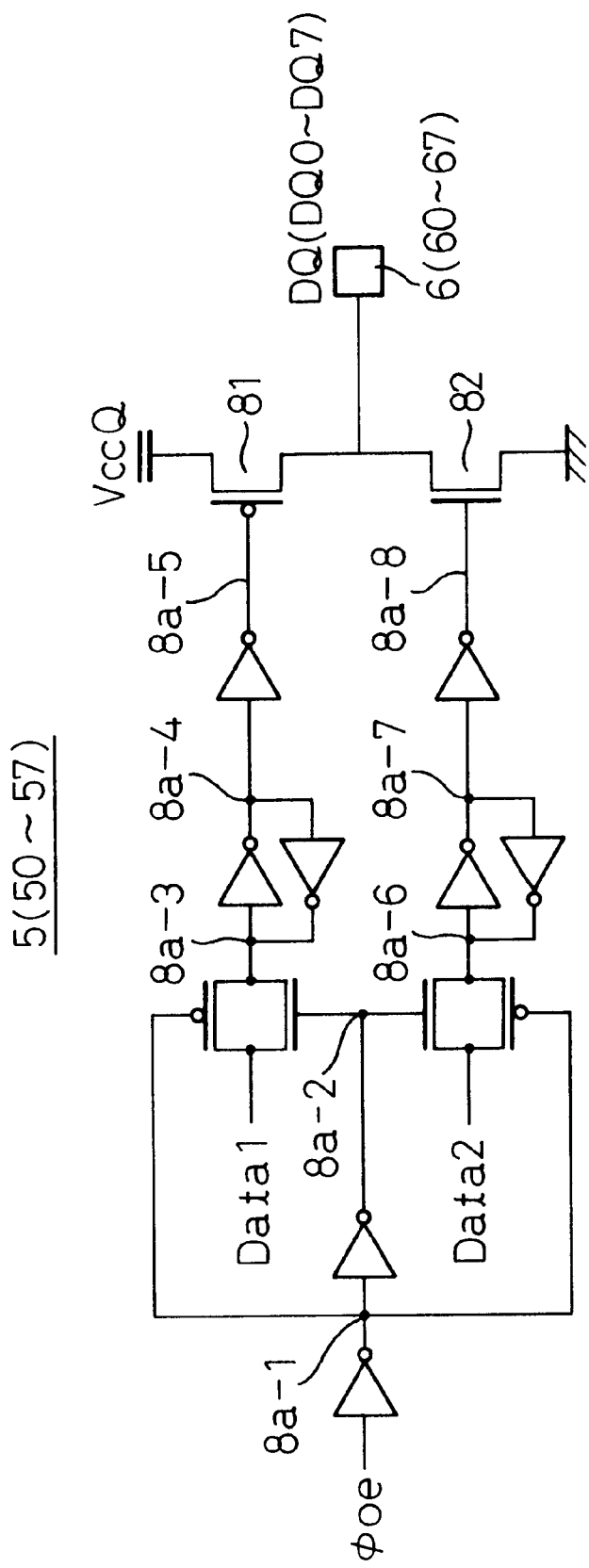
FIG. 26 is a circuit diagram showing a data output buffer of the circuit of FIG. 25.

FIG. 26 shows an example of the output circuit 5 (output circuits 50 to 57) of FIG. 23. Signals Data1 and Data2 correspond to data read out of a cell array 115 through the sense amplifier 117, data bus amplifier 119, and data bus controller 120 of FIG. 25. The signals Data1 and Data2 are each low when the read data is high and are each high when the read data is low. If the read data is not high nor low under a high-impedance (high-Z) state, the data bus controller 120 sets the signal Data1 to high and the signal Data2 to low. A signal φoe corresponds to the internal clock signal from the output timing controller 122 (the first delay controller 21) and serves as an enable signal for the output circuit 5 (output circuits 50 to 57).

When the clock signal φoe becomes high, the signals Data1 and Data2 appear at the data output pad 6 (output pads 60 to 67). When letting the output pad 6 provide a signal of high level, the signal φoe changes from low to high, a node 8a-1 to low, and a node 8a-2 to high, to turn on transfer gates. Then, the signals Data1 and Data2 are transferred to nodes 8a-3 and 8a-6. As a result, a node 8a-5 changes to low and a node 8a-8 to high, to turn on a p-channel transistor 81 and off an n-channel transistor 82. Consequently, the data output pad 6 provides a signal of high level. When the signal φoe changes to low, the transfer gates are turned off to hold the current output state.

The present invention is applicable not only to SDRAMs but also to any semiconductor integrated circuits that provide an output signal in synchronization with an external clock signal.

Figure 27:
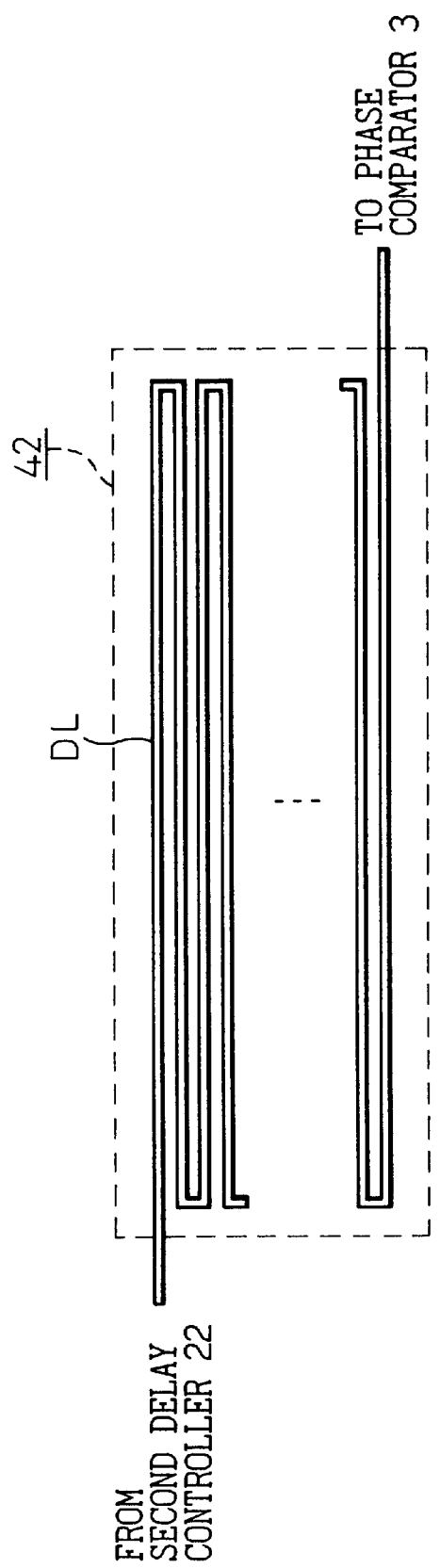
FIG. 27 shows a dummy line for transmitting a dummy internal clock signal in a semiconductor integrated circuit according to the present invention.

FIG. 27 shows an example of a dummy line 42 according to the present invention. The dummy line 42 is formed on a chip and has the same width as a real line 41. The dummy line may be formed in a semiconductor integrated circuit module, or in a semiconductor integrated circuit system. Any dummy line may be replaced with a combination of capacitors or resistors.

Figure 28:
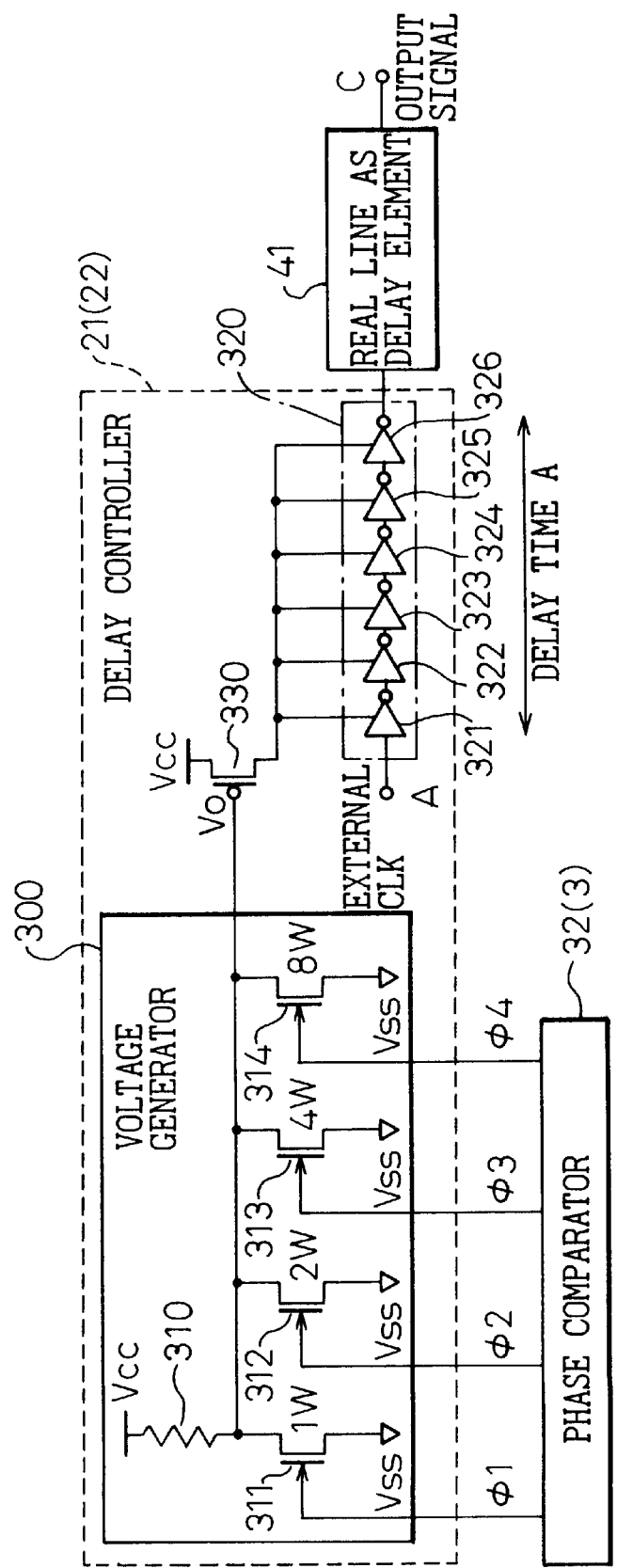
FIG. 28 is a block diagram showing a semiconductor integrated circuit according to a second embodiment of the present invention.

FIG. 28 is a block diagram showing a semiconductor integrated circuit according to a second embodiment of the present invention. Unlike the first embodiment of FIG. 13 that employs, for the voltage generator 200, the transistors 211 to 214 having gate widths 1W to 4W that increase in geometric progression, the second embodiment of FIG. 28 employs voltage generating transistors having gate widths of 1W, 2W, 4W, and 8W that increase in powers of 2.

The circuit of FIG. 28 has a delay controller 21 (22) that has a voltage generator 300 for generating a voltage Vo according to voltage control signals $\phi 1$ to $\phi 4$ provided by a phase comparator 32 (3), a p-channel MOS transistor 330 to which the voltage Vo is applied, and cascaded inverters 321 to 326 serving as delay gates.

The voltage generator 300 consists of a resistor 310 and the n-channel MOS transistors 311 to 314 having different sizes. An end of the resistor 310 is connected to a high-potential power source Vcc, and the other end thereof is commonly connected to the first electrode (drain) of each of the transistors 311 to 314. The control electrodes (gates) of the transistors 311 to 314 receive the voltage control signals $\phi 1$ to $\phi 4$, respectively, from the phase comparator 32. The second electrode (source) of each of the transistors 311 to 314 is connected to a low-potential power source Vss.

The transistors 311 to 314 have different ON resistance values. More precisely, the transistors 311 to 314 have gate widths of 1W, 2W, 4W, and 8W, respectively. Unlike the first embodiment of FIG. 13, the voltage control signals $\phi 1$ to $\phi 4$ take each high or low level to function like outputs of a 4-bit counter. The ON resistance values of turned-on ones of the transistors 311 to 314 and the resistor 310 divide the source voltage, to provide the output voltage Vo of the voltage generator 300.

When the voltage control signals $\phi 1$ to $\phi 4$ are each high, all the transistors 311 to 314 are turned on to drop the output voltage Vo to a lowest level. When only the voltage control signal $\phi 1$ is high to turn on only the transistor 311 having the narrowest gate width, i.e., the highest ON resistance, the output voltage Vo is at the maximum level. The output voltage Vo is controlled in 16 steps between the lowest and highest levels according to the voltage control signals $\phi 1$ to $\phi 4$. Namely, the second embodiment is capable of improving a delay controlling resolution without increasing the number of elements of the phase comparator 32.

A delay controlling operation carried out with the p-channel MOS transistor 330 and delay gate array 320 is the same as that of FIG. 13. The first electrode (drain) of the transistor 330 is connected to the high-potential terminals of the inverters 321 to 326, and the second electrode (source) thereof is connected to the high-potential power source Vcc. The control electrode (gate) of the transistor 330 receives the output voltage Vo of the voltage generator 300. In response to the voltage Vo, the transistor 330 controls a current supplied to an array 320 of the cascaded inverters 321 to 326. As the voltage applied to the gate of the transistor 330 increases, a current passing through the transistor 330 becomes smaller to extend a time for charging and discharging each inverter gate, thereby elongating a delay time achieved by the inverter array (delay gate array) 320.

Unlike the first embodiment of FIG. 13 that sets a one-to-one relationship between voltages and pointers (the voltage control signals $\phi 1$ to $\phi 4$), the second embodiment of FIG. 28 increases the ON resistance values of the transistors 311 to 314 of the voltage generator 300 in powers of 2. Namely, the second embodiment employs the pointers as binary counter outputs, to reduce the number of pointers and realize a fine delay resolution. The ON resistance of a given transistor is inverse proportion to the gate width thereof. Accordingly, increasing the ON resistance values of the transistors 311 to 314 in powers of 2 is equal to setting the gate widths of the same transistors according to inverse numbers of the powers of 2. The second embodiment, therefore, sets the gate widths of the transistors 311 to 314 to 1W, 2W, 4W, and 8W, respectively.

Figure 29:
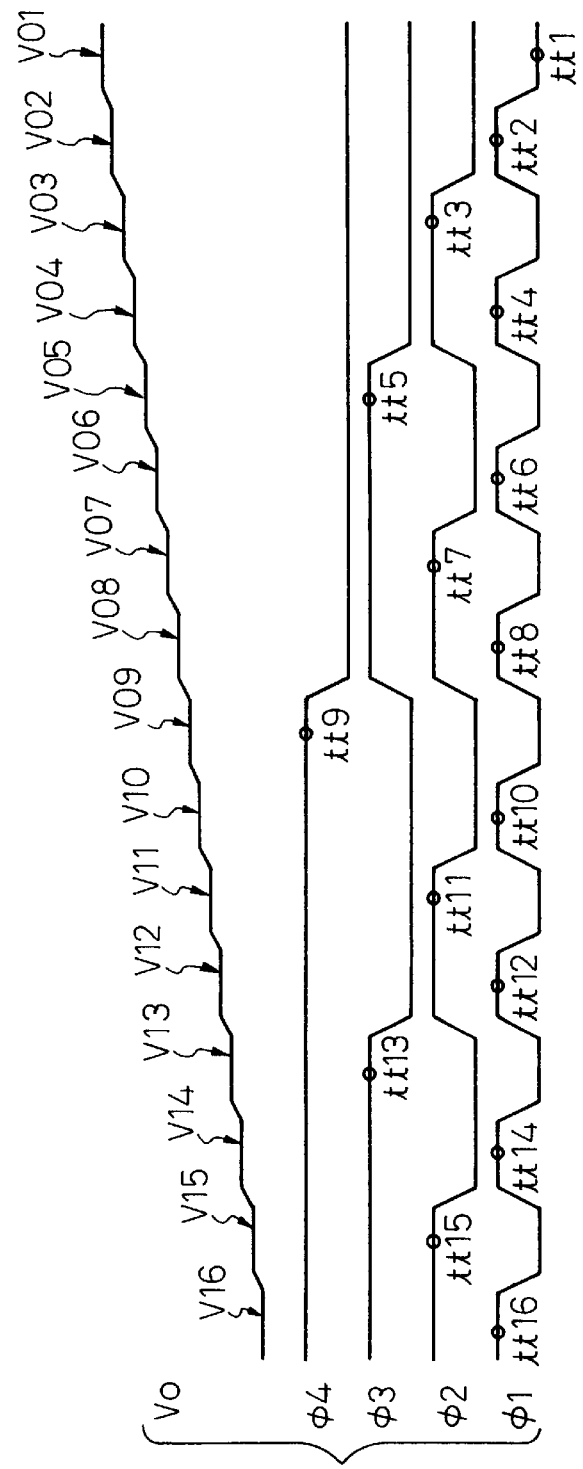
FIG. 29 is a timing chart showing the operation of the circuit of FIG. 28.

FIG. 29 is a timing chart showing the operation of the circuit of FIG. 28.

If the voltage control signals $\phi 1$ to $\phi 4$ from the phase comparator 32 are each low as indicated with a reference mark tt1, all the transistors 311 to 314 are turned off. In this case, the output voltage Vo of the voltage generator 300 is V01, which is equal to the high-potential power source voltage Vcc. If the voltage control signal $\phi 1$ is high and the other voltage control signals $\phi 2$ to $\phi 4$ are each low as indicated with a reference mark tt2, only the transistor 311 having the narrowest gate width, i.e., the highest ON resistance is turned on. In this case, the output voltage Vo is V02 obtained by dividing the source voltage Vcc by the ON resistance of the transistor 311 and the resistor 310. If the voltage control signals $\phi 1$ and $\phi 2$ are high and the others are low as indicated with a reference mark tt3, the transistors 311 and 312 having the largest and second largest ON resistance values are turned on. A combination of the ON resistance values of the transistors 311 and 312 and the resistor 310 provide a voltage V03 as the output voltage Vo.

Similarly, the voltage control signals $\phi 1$ to $\phi 4$ from the phase comparator 32 serve as 4-bit counter outputs as indicated with reference marks tt4 to tt16, so that a combination of the ON resistance values of activated ones of the transistors 311 to 314 and the resistor 310 provide one of voltages V04 to V16 as the output voltage Vo of the voltage generator 300. If the voltage control signals $\phi 1$ to $\phi 4$ are each high as indicated with a reference mark tt16, the transistors 311 to 314 are all turned on, so that a combination of the ON resistance values of all of the transistors and the resistor 310 provide the voltage V16 as the output voltage Vo.

Since the ON resistance values of the transistors 311 to 314 are inverse proportion to the gate widths 1W, 2W, 4W, and 8W thereof that increase in powers of 2, the voltages V01 to V16 provided by combinations of the ON resistance values and the resistor 310 are V01>V02>V03>V04>V05 >V06>V07>V08>V09>V10> V11>V12>V13>V14>V15>V16. As the voltage applied to the gate of the p-channel MOS transistor 330 increases, a current passing through the same decreases to extend a delay time achieved by the delay gate array (inverter array) 320.

The number of transistors forming the voltage generator 300 and the number of inverters forming the delay gate array 320 are determined according to requirements.

In this way, the second embodiment realizes a higher delay resolution with a smaller number of elements compared with the first embodiment.

Figure 30A:
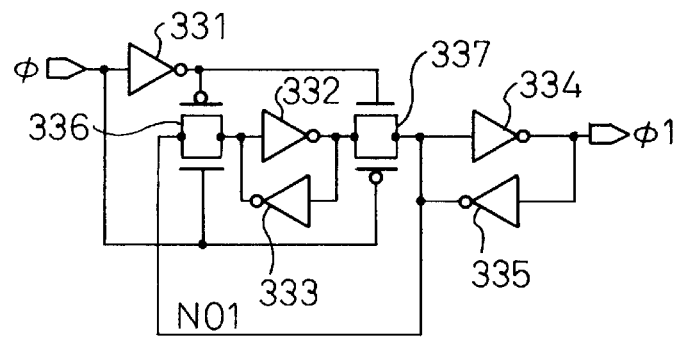
FIGS. 30A and 30B are circuit diagrams showing control sections of a delay controller of the circuit of FIG. 28.
Figure 30B:
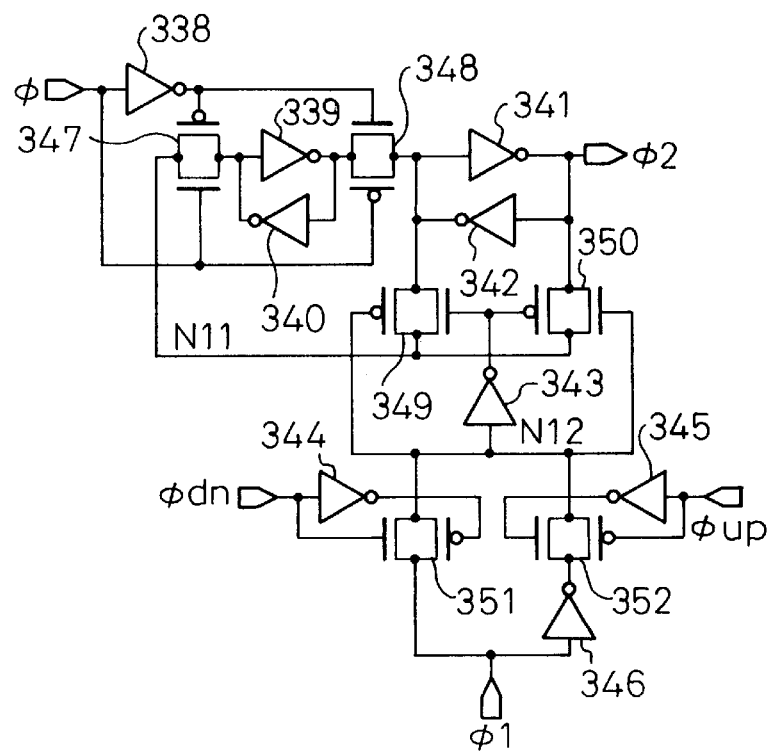
Figure 31A:
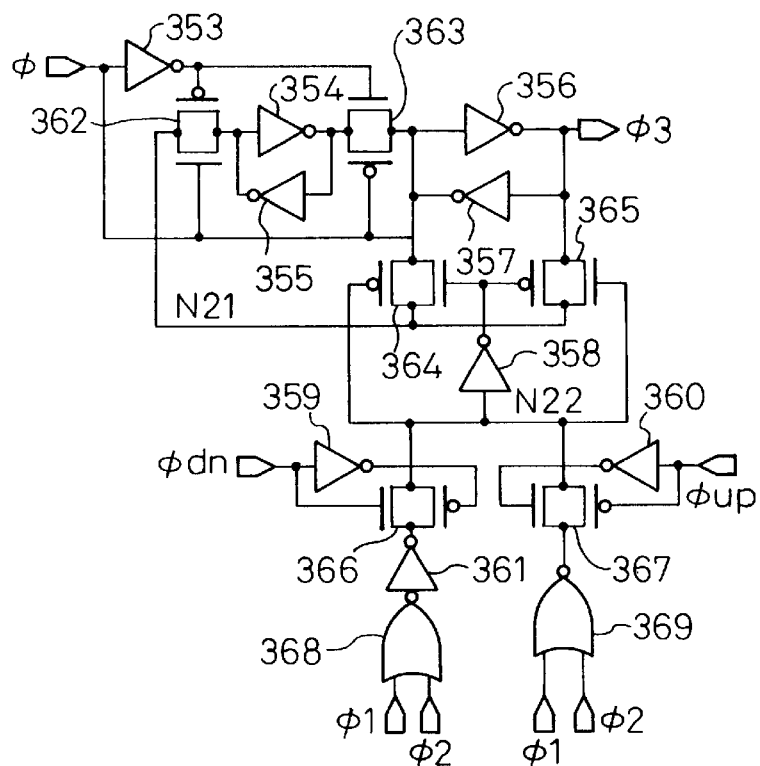
FIGS. 31A and 31B are circuit diagrams showing control sections of the delay controller of the circuit of FIG. 28.
Figure 31B:
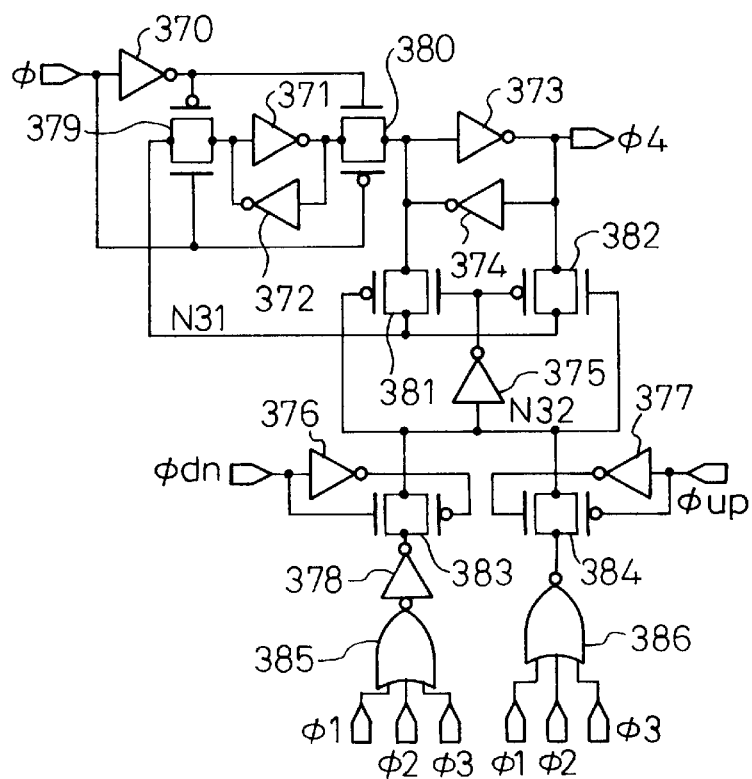
Figure 32:
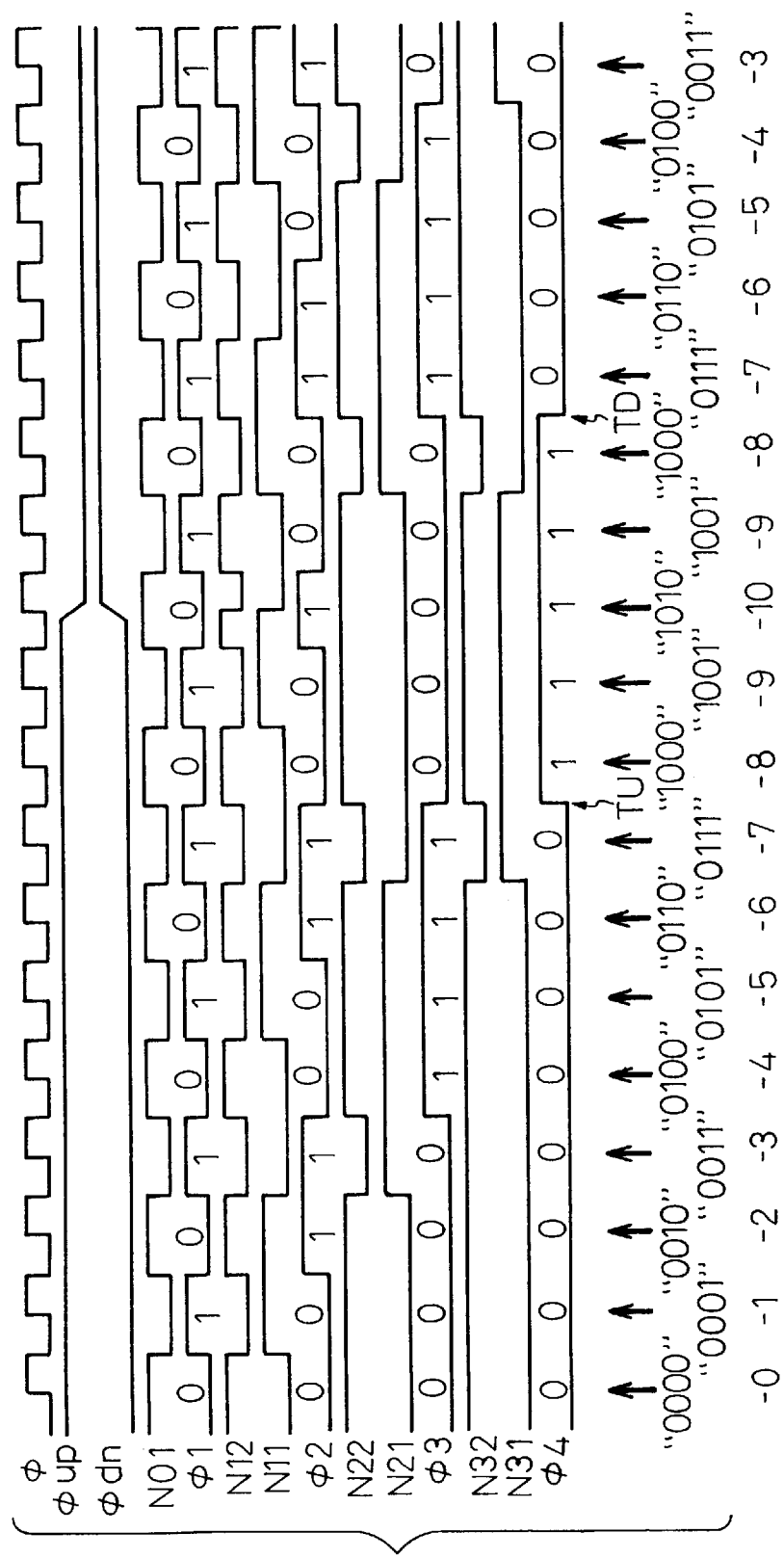
FIG. 32 is a timing chart showing the operation of the circuits of FIGS. 30A to 31B.

FIG. 30A shows a control section for generating the voltage control signal $\phi 1$ for controlling the transistor 311 having the narrowest gate width 1W, i.e., the largest ON resistance, FIG. 30B shows a control section for generating the voltage control signal $\phi 2$ for controlling the transistor 312 having the second narrowest gate width 2W, i.e., the second largest ON resistance, FIG. 31A shows a control section for generating the voltage control signal $\phi 3$ or controlling the transistor 313 having the gate width of 4W, and FIG. 31B shows a control section for generating the voltage control signal φ4 for controlling the transistor 314 having the widest gate width 8W, i.e., the smallest ON resistance. FIG. 32 is a timing chart showing the operations of the control sections of FIGS. 30A to 31B.

In FIG. 30A, the control section for generating the voltage control signal φ1 consists of five inverters 331 to 335 and two transfer gates 336 and 337. The transfer gates 336 and 337 are alternately turned on and off in response to a signal φ. The transfer gate 337 transfers the output of a latch composed of the inverters 332 and 333 to a latch composed of the inverters 334 and 335 and feeds the same back to the transfer gate 336 as indicated with N01. The output of a latch composed of the inverters 334 and 335 is the voltage control signal φ1, which alternates high and low levels at the intervals of the period of the signal φ as shown in FIG. 32.

In FIG. 30B, the control section for generating the voltage control signal φ2 consists of nine inverters 338 to 346 and six transfer gates 347 to 352 and receives signals φ, φup, φdn, and φ1, to provide the voltage control signal φ2. As shown in FIG. 32, the signals φup and φdn select one of the transfer gates 351 and 352 that transfer the voltage control signal φ1 and an inversion thereof to a node N12. The signal at the node N12 selects one of the transfer gates 349 and 350, to transfer a signal at a node N11 to a latch composed of the inverters 341 and 342.

In FIG. 31A, the control section for generating the voltage control signal φ3 consists of nine inverters 353 to 361, six transfer gates 362 to 367, and two 2-input NOR gates 368 and 369. The control section receives the signals φ, φup, φdn, φ1, and φ2 and generates the voltage control signal φ3.

In FIG. 31B, the control section for generating the voltage control signal φ4 consists of nine inverters 370 to 378, six transfer gates 379 to 384, and two 3-input NOR gates 385 and 386. The control section receives the signals φ, φup, φdn, φ1, φ2, and φ3 and generates the voltage control signal φ4. The control sections of FIGS. 31A and 31B are basically identical to each other except the number of input terminals of the NOR gates 368, 369, 385, and 386.

If the input signals φ1 and φ2 (φ1, φ2, φ3) to the NOR gates 368 and 369 (385 and 386) are each high, the output of one of the NOR gates is selected by the transfer gates 366 and 367 (383 and 384) in response to the signals φup and φdn and is transferred to a node N22 (N32). The signal at the node N22 (N32) selects one of the transfer gates 364 and 365 (381 and 382), to transfer a signal at a node N21 (N31) to a latch composed of the inverters 356 and 357 (373 and 374). Then, the latch provides the output signal φ3 (φ4).

When the signal φup is high and the signal φdn is low to indicate an incremental operation, any one of the voltage control signals φ2 to φ4 becomes high in the next clock cycle of the signal φ after the lower voltage control signals (φ1 to φ3) become high. For example, in the incremental operation, the voltage control signal φ4 changes from low to high at the next fall (TU in FIG. 32) of the signal φ after the voltage control signals φ1 to φ3 become high.

When the signal φup is low and the signal φdn is high to indicate a decremental operation, any one of the voltage control signals φ2 to φ4 changes from high to low in the next clock cycle of the signal φ after the lower voltage control signals (φ1 to φ3) become each low. For example, in the decremental operation, the voltage control signal φ4 changes from high to low at the next fall (TD in FIG. 32) of the signal φ after the voltage control signals φ1 to φ3 become low.

The circuits shown in FIGS. 30A to 31B are examples of circuits for generating the voltage control signals φ1 to φ4. Other circuits are possible to provide the same functions with different timing other than that of FIG. 32.

Figure 33:
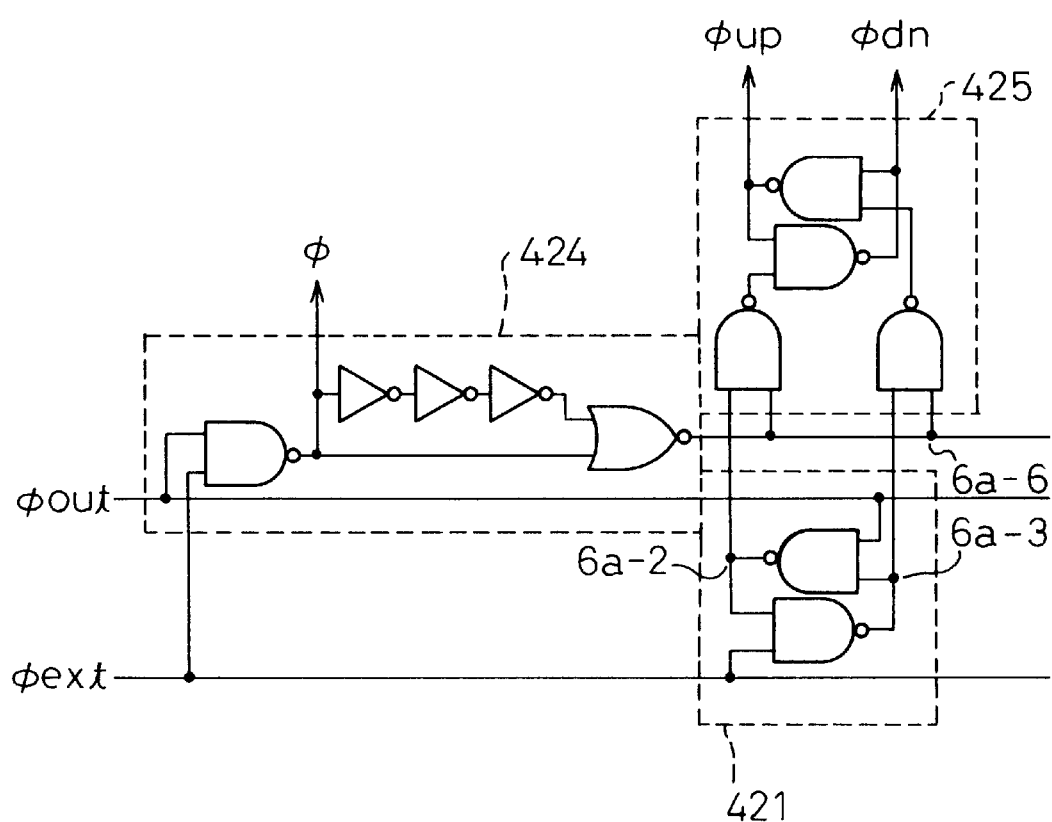
FIG. 33 is a circuit diagram showing a phase comparing section of a phase comparator of the circuit of FIG. 28.
Figure 34B:
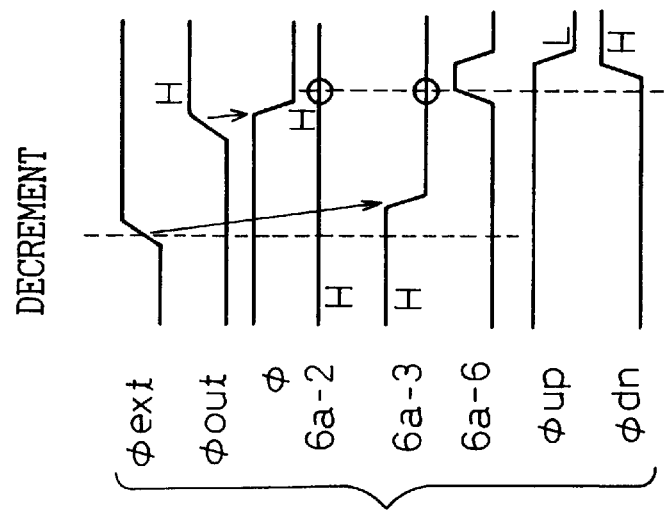
FIGS. 34A and 34B are timing charts showing the operation of the phase comparing section of FIG. 33.
Figure 34A:
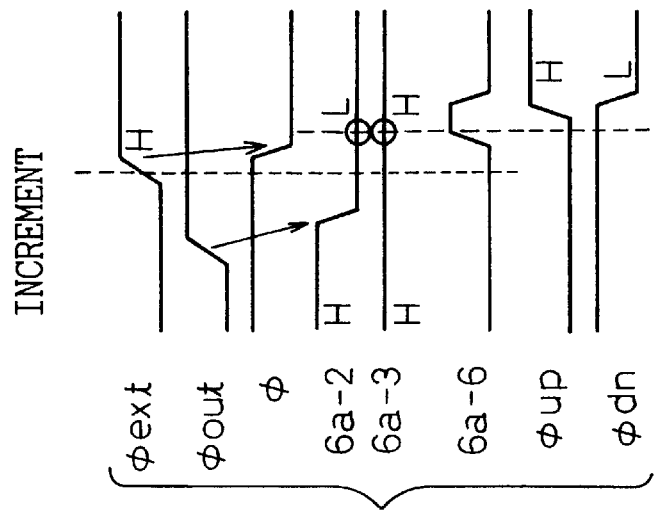

FIG. 33 shows a phase comparing section of the phase comparator 32 of FIG. 28, and FIGS. 34A and 34B are timing charts showing the operations of the phase comparing section.

The phase comparator 32 consists of the phase comparing section of FIG. 33 and an amplifying section (FIG. 19).

In FIG. 33, the phase comparing section compares a dummy internal clock signal φout with an external clock signal φext serving as a reference signal. Output signals φ, φup, and φdn are transferred to the amplifying section. The circuit of FIG. 33 is not provided with the flip-flop 422, delay circuit 423, and latch 426 of FIG. 5.

The phase comparing section is composed of a flip-flop 421 having two NAND gates, a latch 425 for latching the state of the flip-flop 421, and a generator 424 for generating an activation signal for the latch 425.

FIG. 34A shows that the phase of the dummy internal clock signal φout is ahead of the phase of the reference signal φext. Namely, the signal φout changes from low to high before the signal φext shows the same change. When the signals φout and φext are each at low level, nodes 6a-2 and 6a-3 of the flip-flop 421 are each high. When the signal φout changes from low to high, the node 6a-2 changes from high to low. Thereafter, the signal φext changes from low to high. In spite of this, the terminal voltage of the flip-flop 421 is unchanged because it is already fixed. As a result, the node 6a-2 is continuously low and 6a-3 high.

When the signal φext changes from low to high, the output signal φ of the generator 424 changes from high to low, to apply a high pulse to the node 6a-6. Since the node 6a-6 is connected to the NAND gates of the latch 425, the NAND gates are temporarily activated, and the latch 425 latches the terminal voltage of the flip-flip 421. As a result, the output signal φup changes to high and φdn to low.

FIG. 34B shows that the phase of the dummy internal clock signal φout is behind the phase of the reference signal φext and that the signal φout changes from low to high after the same change in the signal φext. In this case, the signal φext causes changes in the flip-flop 421, and the node 6a-3 changes from high to low. As a result, the output signal φup changes to low and φdn to high.

In this way, a rise of the reference signal φext is used to determine whether a rise of the dummy internal clock signal φout is ahead or behind. The determination is latched as values of the output signals φup and φdn. According to these values, it is determined to increment or decrement delays in the delay controllers 21 and 22.

In the above embodiments, the voltage generator (200, 300) employs four transistors (211 to 214, 311 to 314), and the delay gate array (220, 320) employs six inverters (221 to 226, 321 to 326). These are only examples for the sake of simplicity of explanation. They may be in various numbers. The transistors and delay gates are not limited to the n-channel MOS transistors and inverters. The present invention is applicable not only to the SDRAMs but also to many other semiconductor integrated circuits.

As explained above in detail, the present invention provides a semiconductor integrated circuit that employs voltage control signals to control a voltage generator, which generates a voltage to control a current flowing to a delay gate array that provides a delay. The circuit of the present invention realizes a high delay controlling resolution with a small number of elements and a small circuit scale.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor integrated circuit comprising:

a voltage generator for receiving voltage control signals and for generating an output voltage in response to the voltage control signals, said voltage generator including a resistor and a plurality of transistors having different sizes and turned ON and OFF in response to the voltage control signals, so that said resistor and turned-ON ones of said transistors divide a source voltage and produce the output voltage thereof;

a delay gate array having delay gates for producing a delay; and a current control circuit for controlling a current flowing to said delay gate array in response to the output voltage of said voltage generator, thereby controlling the delay produced by said delay gate array.

2. A semiconductor integrated circuit as claimed in claim 1, wherein said transistors have different ON resistance values that increase in geometric progression, and any one of said transistors is turned ON in response to the voltage control signals.

3. A semiconductor integrated circuit as claimed in claim 2, wherein said transistors have different gate widths that increase in geometric progression.

4. A semiconductor integrated circuit as claimed in claim 1, wherein said transistors have different ON resistance values that increase in powers of 2, and the voltage control signals serve as binary counter outputs.

5. A semiconductor integrated circuit as claimed in claim 4, wherein said transistors have different gate widths that increase in powers of 2.

6. A semiconductor integrated circuit as claimed in claim 1, wherein said current control circuit is a p-channel type MIS transistor, and said transistors of said voltage generator are n-channel type MIS transistors.

7. A semiconductor integrated circuit having:

first and second delay controllers each for receiving an input signal;

a plurality of object circuits for receiving an internal signal output from said first delay controller through a real line;

a dummy line for providing a dummy delay corresponding to a delay in said real line; and a phase comparator for receiving the input signal and a dummy internal signal output from said second delay controller through said dummy line, for comparing phases of the received input and dummy internal signals with each other, and for controlling delays in said first and second delay controllers in accordance with the comparison result, each of said first and second delay controllers comprising:

a voltage generator for receiving voltage control signals output from said phase comparator and for generating an output voltage in response to the voltage control signals, said voltage generator including a resistor and a plurality of transistors having different sizes and turned ON and OFF in response to the voltage control signals, so that said resistor and turned-ON ones of said transistors divide a source voltage and produce the output voltage thereof;

a delay gate array having delay gates for producing a delay; and a current control circuit for controlling a current flowing to said delay gate array in response to the output voltage of said voltage generator, thereby controlling the delay produced by said delay gate array.

8. A semiconductor integrated circuit as claimed in claim 7, wherein said transistors have different ON resistance values that increase in geometric progression, and any one of said transistors is turned ON in response to the voltage control signals.

9. A semiconductor integrated circuit as claimed in claim 8, wherein said transistors have different gate widths that increase in geometric progression.

10. A semiconductor integrated circuit as claimed in claim 7, wherein said transistors have different ON resistance values that increase in powers of 2, and the voltage control signals serve as binary counter outputs.

11. A semiconductor integrated circuit as claimed in claim 10, wherein said transistors have different gate widths that increase in powers of 2.

12. A semiconductor integrated circuit as claimed in claim 7, wherein said current control circuit is a p-channel type MIS transistor, and said transistors of said voltage generator are n-channel type MIS transistors.

13. A semiconductor integrated circuit as claimed in claim 7, wherein said semiconductor integrated circuit is a synchronous DRAM, and said object circuits are data output buffer circuits of said synchronous DRAM.

14. A semiconductor integrated circuit as claimed in claim 13, wherein the internal signal serves as an enable signal for said data output buffer circuits.

* * * * *